(12) United States Patent
van der Straten et al.

(10) Patent No.: US 11,069,566 B2
(45) Date of Patent: Jul. 20, 2021

(54) HYBRID SIDEWALL BARRIER FACILITATING LOW RESISTANCE INTERCONNECTION

(71) Applicant: International Business Machines Corporation, Armonk, NY (US)

(72) Inventors: Oscar van der Straten, Guilderland Center, NY (US); Koichi Motoyama, Clifton Park, NY (US); Joseph F. Maniscalco, Lake Katrine, NY (US); Scott DeVries, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/157,897

(22) Filed: Oct. 11, 2018

(65) Prior Publication Data

US 2020/0118870 A1 Apr. 16, 2020

(51) Int. Cl.
*H01L 23/52* (2006.01)
*H01L 23/528* (2006.01)
*H01L 23/532* (2006.01)
*H01L 23/48* (2006.01)
(Continued)

(52) U.S. Cl.
CPC .... *H01L 21/76844* (2013.01); *H01L 21/2855* (2013.01); *H01L 21/28562* (2013.01); *H01L 21/7685* (2013.01); *H01L 21/76814* (2013.01); *H01L 21/76846* (2013.01); *H01L 2224/05006* (2013.01); *H01L 2224/05546* (2013.01)

(58) Field of Classification Search
CPC ........... H01L 23/53223; H01L 23/5226; H01L 23/532
See application file for complete search history.

(56) References Cited

U.S. PATENT DOCUMENTS

| | | | |
|---|---|---|---|
| 6,258,707 B1 * | 7/2001 | Uzoh | H01L 23/5226 257/E21.257 |
| 6,764,940 B1 | 7/2004 | Rozbicki et al. | |

(Continued)

OTHER PUBLICATIONS

Besling, et al., Continuity and morphology of TaN bafflers deposited by Atomic Layer Deposition and comparison with physical vapor deposition, Microelectronic Engineering, 2004, pp. 60-69, vol. 76.

*Primary Examiner* — Omar F Mojaddedi
(74) *Attorney, Agent, or Firm* — Amin, Turocy & Watson, LLP

(57) ABSTRACT

Devices and methods that can facilitate hybrid sidewall barrier and low resistance interconnect components are provided. According to an embodiment, a device can comprise a first interconnect material layer that can have a first opening that can comprise a first discontinuous barrier liner coupled to first sidewalls of the first opening and a first continuous barrier layer coupled to the first discontinuous barrier liner and the first sidewalls. The device can further comprise a second interconnect material layer coupled to the first interconnect material layer, the second interconnect material layer can have a second opening that can comprise a second discontinuous barrier liner coupled to second sidewalls of the second opening, a second continuous barrier layer coupled to the second discontinuous barrier liner and the second sidewalls.

6 Claims, 15 Drawing Sheets

(51) Int. Cl.
*H01L 21/768* (2006.01)
*H01L 21/285* (2006.01)

(56) References Cited

U.S. PATENT DOCUMENTS

| | | | |
|---|---|---|---|
| 6,998,337 B1 * | 2/2006 | Tran | H01L 21/2885 |
| | | | 257/E21.175 |
| 7,049,226 B2 | 5/2006 | Chung et al. | |
| 7,186,648 B1 | 3/2007 | Rozbicki et al. | |
| 7,196,420 B1 * | 3/2007 | Burke | H01L 21/76807 |
| | | | 257/734 |
| 7,253,109 B2 | 8/2007 | Ding et al. | |
| 7,576,002 B2 | 8/2009 | Chen et al. | |
| 7,589,021 B2 | 9/2009 | Hong | |
| 7,615,489 B1 * | 11/2009 | Fu | H01L 23/53223 |
| | | | 257/E21.575 |
| 7,855,147 B1 | 12/2010 | Dulkin et al. | |
| 10,049,980 B1 | 8/2018 | Adusumilli et al. | |
| 2002/0047206 A1 * | 4/2002 | Uzoh | H01L 23/53238 |
| | | | 257/758 |
| 2005/0048767 A1 * | 3/2005 | Matsumoto | H01L 21/76846 |
| | | | 438/629 |
| 2006/0024953 A1 | 2/2006 | Papa Rao et al. | |
| 2012/0104610 A1 | 5/2012 | Filippi et al. | |
| 2014/0246775 A1 * | 9/2014 | Ryan | H01L 23/53238 |
| | | | 257/751 |

\* cited by examiner

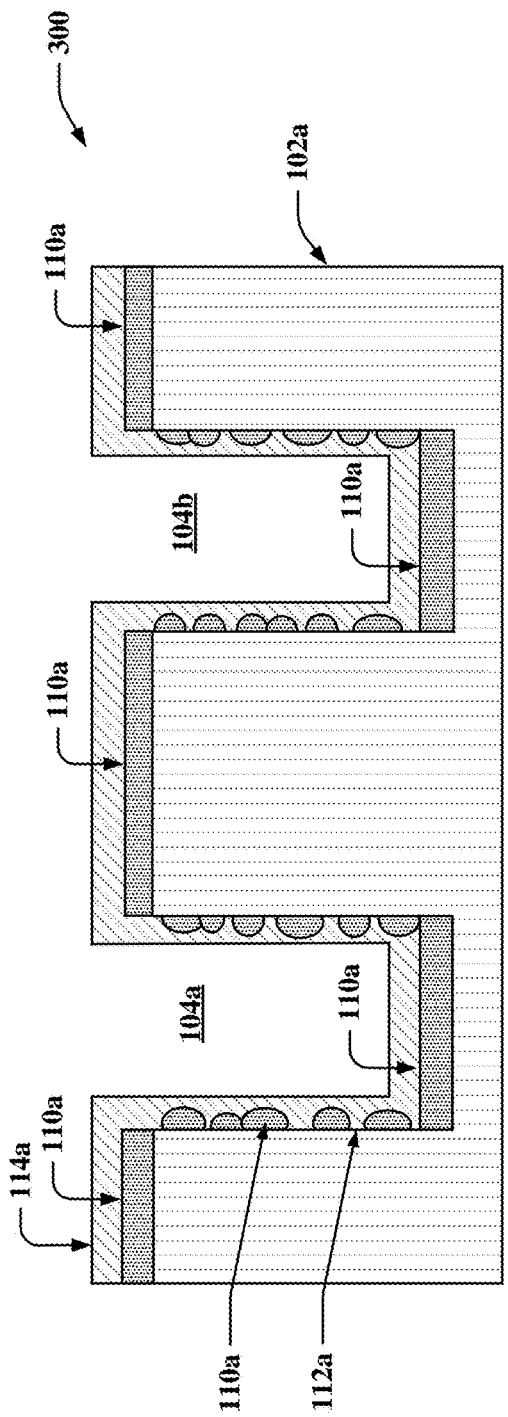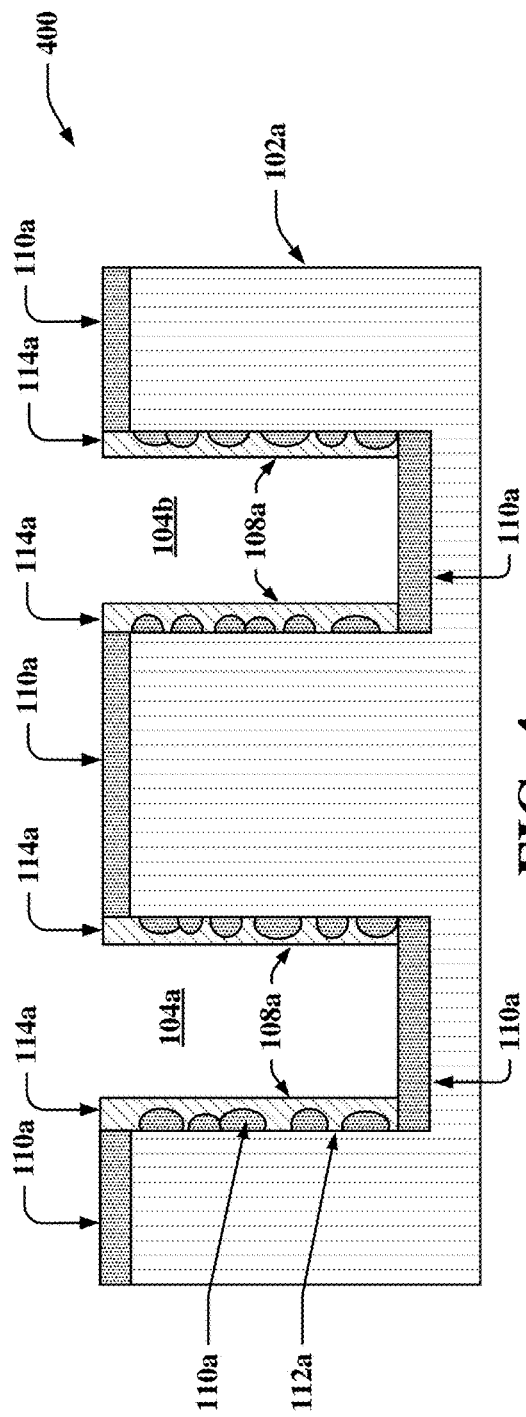

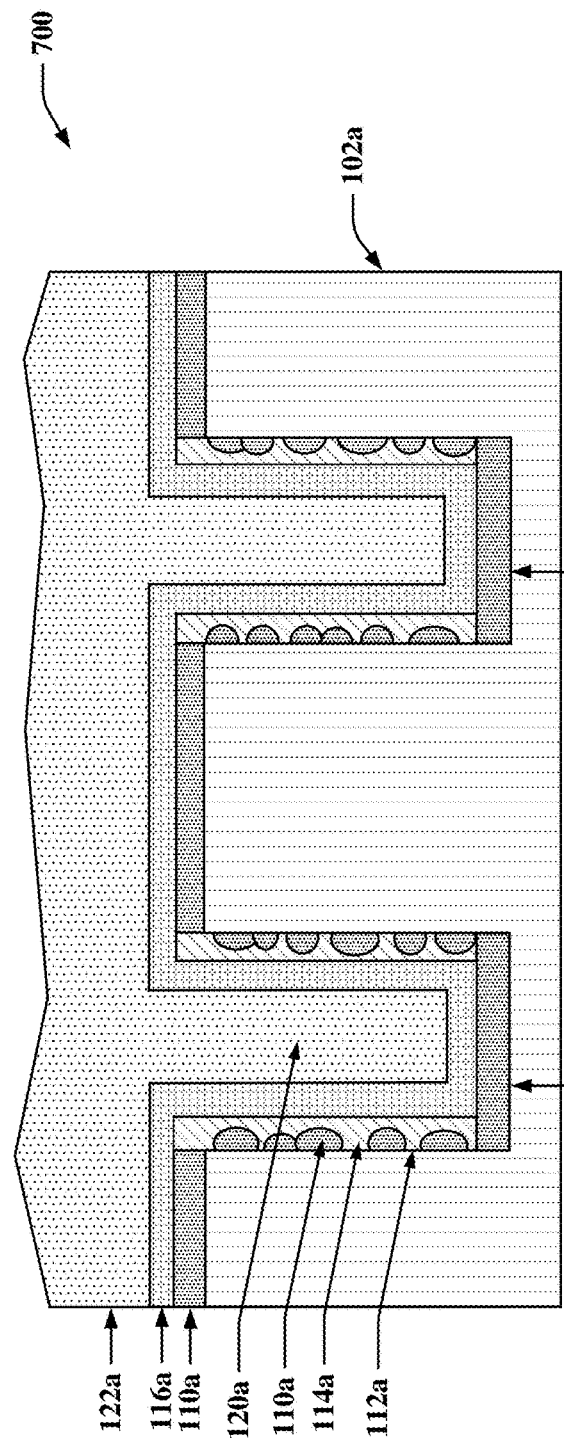
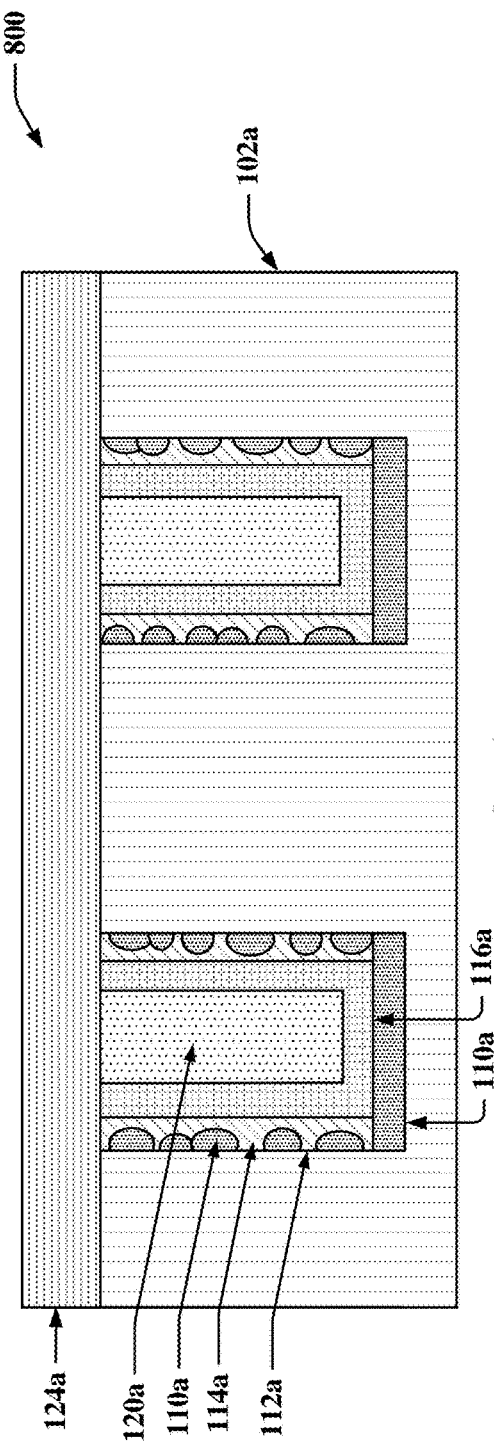

1800

1802 — Forming a first discontinuous barrier liner on first sidewalls of a first opening of a first interconnect material layer, and a first continuous barrier layer on the first discontinuous barrier liner and the first sidewalls 1804 — Forming a second discontinuous barrier liner on second sidewalls of a second opening of a second interconnect material layer, and a second continuous barrier layer on the second discontinuous barrier liner and the second sidewalls 1806 — Removing a portion of the second continuous barrier layer formed on a section of the second discontinuous barrier liner formed on a bottom surface of the second opening; and forming a second seed enhancement liner on the second continuous barrier layer 1810 — Coupling a first interconnect metallic material to a first seed enhancement liner formed on the first continuous barrier layer, and a second interconnect metallic material to the second seed enhancement liner formed on the second continuous barrier layer 1812 — Electrically coupling the first interconnect metallic material to the second interconnect metallic material

FIG. 18

HYBRID SIDEWALL BARRIER FACILITATING LOW RESISTANCE INTERCONNECTION

BACKGROUND

The subject disclosure relates to an interconnect device and a method for forming the same. More specifically, the subject disclosure relates to a hybrid sidewall barrier facilitating low resistance interconnection and a method for forming the same.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, methods, computer-implemented methods, apparatus, and/or computer program products that facilitate hybrid sidewall barrier and low resistance interconnection components are described.

According to an embodiment, a device can comprise an interconnect material layer that can have an opening that can comprise a discontinuous barrier liner coupled to sidewalls of the opening and a continuous barrier layer coupled to the discontinuous barrier liner and the sidewalls.

According to an embodiment, a device can comprise a first interconnect material layer that can have a first opening that can comprise a first discontinuous barrier liner coupled to first sidewalls of the first opening and a first continuous barrier layer coupled to the first discontinuous barrier liner and the first sidewalls. The device can further comprise a second interconnect material layer coupled to the first interconnect material layer, the second interconnect material layer can have a second opening that can comprise a second discontinuous barrier liner coupled to second sidewalls of the second opening, a second continuous barrier layer coupled to the second discontinuous barrier liner and the second sidewalls.

According to an embodiment, a method can comprise forming a first discontinuous barrier liner on first sidewalls of a first opening of a first interconnect material layer, and a first continuous barrier layer on the first discontinuous barrier liner and the first sidewalls. The method can further comprise forming a second discontinuous barrier liner on second sidewalls of a second opening of a second interconnect material layer, and a second continuous barrier layer on the second discontinuous barrier liner and the second sidewalls.

DESCRIPTION OF THE DRAWINGS

FIG. 3 illustrates a cross-sectional side view of an example, non-limiting device that can facilitate hybrid sidewall barrier and low resistance interconnect components in accordance with one or more embodiments described herein.

FIG. 4 illustrates a cross-sectional side view of an example, non-limiting device that can facilitate hybrid sidewall barrier and low resistance interconnect components in accordance with one or more embodiments described herein.

FIG. 7 illustrates a cross-sectional side view of an example, non-limiting device that can facilitate hybrid sidewall barrier and low resistance interconnect components in accordance with one or more embodiments described herein.

FIG. 8 illustrates a cross-sectional side view of an example, non-limiting device that can facilitate hybrid sidewall barrier and low resistance interconnect components in accordance with one or more embodiments described herein.

FIG. 18 illustrates a flow diagram of an example, non-limiting method that can facilitate implementing hybrid sidewall barrier and low resistance interconnect components in accordance with one or more embodiments described herein.

DETAILED DESCRIPTION

Figure 1:
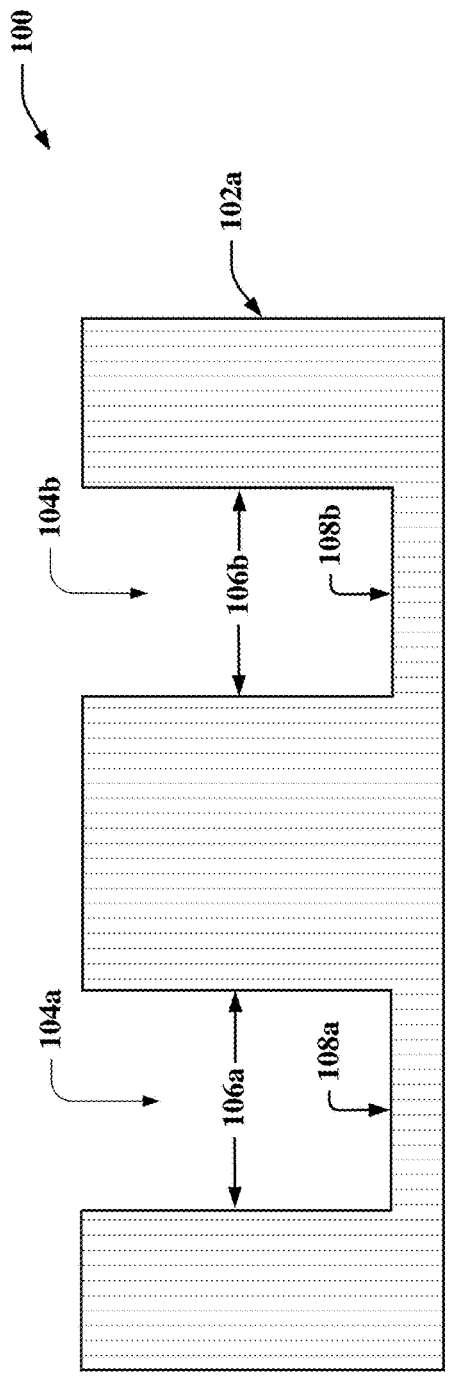
FIG. 1 illustrates a cross-sectional side view of an example, non-limiting device that can facilitate hybrid sidewall barrier and low resistance interconnect components in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. It is noted that the drawings of the present application are provided for illustrative purposes only and, as such, the drawings are not drawn to scale.

FIGS. 1-16 illustrate an example, non-limiting multi-step fabrication sequence that can be implemented to fabricate one or more embodiments of the subject disclosure described herein and/or illustrated in the figures. For example, the non-limiting multi-step fabrication sequence illustrated in FIGS. 1-16 can be implemented to fabricate a single layer of a multi-layered interconnect device and/or multiple layers of such a multi-layered interconnect device. For instance, the non-limiting multi-step fabrication sequence illustrated in FIGS. 1-16 can be implemented to fabricate device 800 (illustrated in FIG. 8) and/or interconnect device 1600 (illustrated in FIG. 16) in accordance with one or more embodiments described herein.

According to multiple embodiments, the subject disclosure described herein and/or illustrated in the figures (e.g., device 800, interconnect device 1600, etc.) can constitute one or more components of an integrated circuit fabricated in a semiconducting device. For example, device 800 and/or interconnect device 1600 can constitute one or more components of a back end of line (BEOL) portion of an integrated circuit. For instance, device 800 and/or interconnect device 1600 can constitute one or more components of a metallization layer(s) that can facilitate interconnecting (e.g., electrically coupling) one or more components of a front end of line (FEOL) portion (e.g., transistors, capacitors, resistors, etc.) of a semiconducting device to a packaging portion (e.g., an under-bump metallization component) of such a semiconducting device.

As described below with reference to FIGS. 1-16, fabrication of the various embodiments of the subject disclosure described herein and/or illustrated in the figures (e.g., device 800, interconnect device 1600, etc.) can comprise a multi-step sequence of, for example, photolithographic and/or chemical processing steps that facilitate gradual creation of electronic-based systems, devices, components, and/or circuits in a semiconducting device (e.g., an integrated circuit). For instance, the various embodiments of the subject disclosure described herein and/or illustrated in the figures (e.g., device 800, interconnect device 1600, etc.) can be fabricated by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, etc.), etching techniques (e.g., reactive ion etching (RIE), dry etching, wet etching, ion beam etching, plasma etching, laser ablation, etc.), evaporation techniques, sputtering techniques, plasma ashing techniques, thermal treatments (e.g., rapid thermal anneal, furnace anneals, thermal oxidation, etc.), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

As described below with reference to FIGS. 1-16, fabrication of the various embodiments of the subject disclosure described herein and/or illustrated in the figures (e.g., device 800, interconnect device 1600, etc.) can be fabricated using various materials. For example, the various embodiments of the subject disclosure described herein and/or illustrated in the figures (e.g., device 800, interconnect device 1600, etc.) can be fabricated using materials of one or more different material classes including, but not limited to: conductive materials, semiconducting materials, superconducting materials, dielectric materials, polymer materials, organic materials, inorganic materials, non-conductive materials, and/or another material that can be utilized with one or more of the techniques described above for fabricating an integrated circuit.

It will be understood that when an element as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

FIG. 1 illustrates a cross-sectional side view of an example, non-limiting device 100 that can facilitate hybrid sidewall barrier and low resistance interconnect components in accordance with one or more embodiments described herein. According to multiple embodiments, device 100 can comprise an interconnect material layer 102a, which can comprise one or more openings 104a, 104b.

In some embodiments, interconnect material layer 102a can comprise a dielectric material layer. For example, interconnect material layer 102a can comprise a dielectric material(s) including, but not limited to, silicon dioxide ($SiO_2$), silsesquioxanes, carbon (C) doped oxides (e.g., organosilicates) that can comprise atoms of silicon (Si), carbon (C), oxygen (O), and/or hydrogen (H), thermosetting polyarylene ethers, and/or another dielectric material or multi-layers thereof. As referenced herein, "polyarylene" can denote aryl moieties or inertly substituted aryl moieties which can be linked together by bonds, fused rings, or inert linking groups including, but not limited to, oxygen (O), sulfur (S), sulfone, sulfoxide, carbonyl, and/or another linking group.

In some embodiments, interconnect material layer 102a can comprise a dielectric material having a dielectric constant of approximately 4.0 or less (all dielectric constants indicated herein are relative to a vacuum, unless otherwise noted). For example, interconnect material layer 102a can comprise a dielectric material having a dielectric constant of approximately 2.8 or less. In some embodiments, such dielectric materials having a dielectric constant of approximately 4.0 or less can have a lower parasitic cross talk as compared with dielectric materials that have a higher dielectric constant than 4.0.

In some embodiments, interconnect material layer 102a can comprise an inter-level or intra-level dielectric material including, but not limited to, inorganic dielectrics, organic dielectrics, and/or another material. In some embodiments, interconnect material layer 102a can comprise a single inter-level or intra-level dielectric material. In some embodiments, interconnect material layer 102a can comprise a multi-layered dielectric material stack comprising at least two different inter-level or intra-level dielectrics. In some embodiments, interconnect material layer 102a can comprise a non-porous material. In some embodiments, interconnect material layer 102a can comprise a porous material.

In some embodiments, interconnect material layer 102a can comprise a thickness that can vary depending upon the type of dielectric material(s) used. In some embodiments, interconnect material layer 102a can comprise any thickness that ensures mechanical stability of all material layers and/or components coupled to interconnect material layer 102a. For example, interconnect material layer 102a can be ground (e.g., via backgrinding) to a thickness (e.g., height) ranging from 20 nanometers (nm) to 1000 nm. In some embodiments, interconnect material layer 102a can comprise a thickness that is less than 50 nm or greater than 1000 nm.

In some embodiments, a base substrate (not depicted the figures of the subject disclosure) can be located directly beneath interconnect material layer 102a. For example, in some embodiments, interconnect material layer 102a can be formed on such a base substrate utilizing a deposition processes including, but not limited to, physical vapor deposition (PVD), chemical vapor deposition (CVD), atomic layer deposition (ALD), plasma enhanced chemical vapor deposition (PECVD), spin-on coating, sputtering, and/or another deposition process. In some embodiments, such a base substrate can comprise a semiconductor material, an insulator material, a conductive material, and/or another material or any combination thereof. In some embodiments, such a base substrate can comprise any material having semiconductor properties including, but not limited to, silicon (Si), sapphire (e.g., aluminum oxide ($Al_2O_3$)), silicon-germanium (SiGe), silicon-germanium-carbon (SiGeC), silicon carbide (SiC), germanium (Ge) alloys, III/V compound semiconductors, II/VI compound semiconductors, and/or another material. In some embodiments, such a base substrate can comprise a layered semiconductor including, but not limited to, silicon/silicon-germanium (Si/SiGe), silicon/silicon carbide (Si/SiC), silicon-on-insulators (SOIs), silicon germanium-on-insulators (SGOIs), and/or another layered semiconductor.

In some embodiments, such a base substrate can comprise an insulator material including, but not limited to, an organic dielectric material, an inorganic dielectric material, and/or another insulator material or any combination thereof including multi-layers. In some embodiments, such a base substrate can comprise a material that is a different material than interconnect material layer 102a. In some embodiments, such a base substrate can comprise a conductive material including, but not limited to, polycrystalline silicon (poly-Si), an elemental metal, alloys of elemental metals, a metal silicide, a metal nitride, and/or another conductive material or any combination thereof including multi-layers.

In some embodiments, such a base substrate can comprise a semiconductor material and one or more semiconductor devices can be fabricated thereon such as, for example, complementary metal oxide semiconductor (CMOS) devices. In some embodiments, such a base substrate can comprise a combination of an insulator material and a conductive material. In some embodiments, such a base substrate can constitute an underlying interconnect level of a multi-layered interconnect device.

In some embodiments, interconnect material layer 102a can be formed utilizing a deposition process including, but not limited to, physical vapor deposition (PVD), chemical vapor deposition (CVD), atomic layer deposition (ALD), plasma enhanced chemical vapor deposition (PECVD), spin-on coating, sputtering, and/or another deposition process. In some embodiments, interconnect material layer 102a can be formed on a base substrate such as, for example, the base substrate described above, where interconnect material layer 102a can constitute an interconnect material layer of a multi-layered interconnect device (e.g., as illustrated in the embodiment depicted in FIG. 16).

According to multiple embodiments, one or more openings 104a, 104b can be formed into interconnect material layer 102a. For example, openings 104a, 104b can be formed utilizing a patterning process. In some embodiments, such a patterning process can be implemented using lithography and etching techniques. For example, such a patterning process can be implemented by using a lithographic process comprising: forming a photoresist (not shown) atop a material or material stack to be patterned such as, for example, interconnect material layer 102a; exposing the photoresist to a desired pattern of radiation; and developing the exposed photoresist utilizing a conventional resist developer. In some embodiments, such a photoresist can comprise a positive-tone photoresist, a negative-tone photoresist, a hybrid-tone photoresist, and/or another photoresist. In some embodiments, an etching process can be employed to form openings 104a, 104b. For example, such etching process can comprise a dry etching process (e.g., reactive ion etching (RIE), ion beam etching, plasma etching, laser ablation, etc.) and/or a wet chemical etching process. In some embodiments, reactive ion etching (RIE) can be employed to etch openings 104a, 104b into interconnect material layer 102a.

In some embodiments, openings 104a, 104b can extend entirely through interconnect material layer 102a. In such embodiments, openings 104a, 104b can physically expose a portion of an underlying base substrate (e.g., the base substrate described above). In some embodiments, openings 104a, 104b can extend only partially through interconnect material layer 102a (e.g., as illustrated in FIG. 1), thereby exposing a sub-surface portion of interconnect material layer 102a. For example, as depicted in FIG. 1, openings 104a, 104b can extend only partially through interconnect material layer 102a, thereby exposing bottom surfaces 108a, 108b of openings 104a, 104b. As referenced herein, "sub-surface portion" can describe a portion of a material that is located between a topmost surface and a bottommost surface of such material. In some embodiments, openings 104a, 104b can comprise a same depth. In some embodiments, openings 104a, 104b can comprise different depths.

In some embodiments, openings 104a, 104b can respectively comprise sidewalls 106a, 106b (e.g., vertical sidewalls as depicted in FIG. 1) and/or a bottom surface 108a, 108b (e.g., a horizontal bottom surface as depicted in FIG. 1). In some embodiments, sidewalls 106a, 106b and/or bottom surfaces 108a, 108b can comprise physically exposed surfaces of interconnect material layer 102a. Although device 100 illustrated in FIG. 1 depicts two openings 104a, 104b, the subject disclosure is not so limited. For example, in some embodiments, interconnect material layer 102a can comprise a single opening formed therein. In another example, interconnect material layer 102a can comprise a plurality of openings formed therein.

In some embodiments, openings 104a, 104b can comprise a via opening, a line opening, and/or a combined via/line opening formed in interconnect material layer 102a. As referenced herein, a "via" can comprise a through-silicon via (TSV) and a "line" can comprise an electrically conductive line (e.g., a wire trace). For example, a combined via/line opening can be formed in interconnect material layer 102a, where such a via opening can be formed first and a line opening can be formed atop and in communication (e.g., electrically, physically, etc.) with the via opening. In another example, a combined via/line opening can be formed in interconnect material layer 102a, where such a line opening can be formed first and then a via opening can be formed atop and in communication (e.g., electrically, physically, etc.) with the line opening. In FIG. 1, and by way of an example, openings 104a, 104b comprise line openings. In some embodiments, such a combined via/line opening can be formed in interconnect material layer 102a by employing a dual damascene process (e.g., including at least one iteration of the lithography and etching steps described above).

Figure 2:
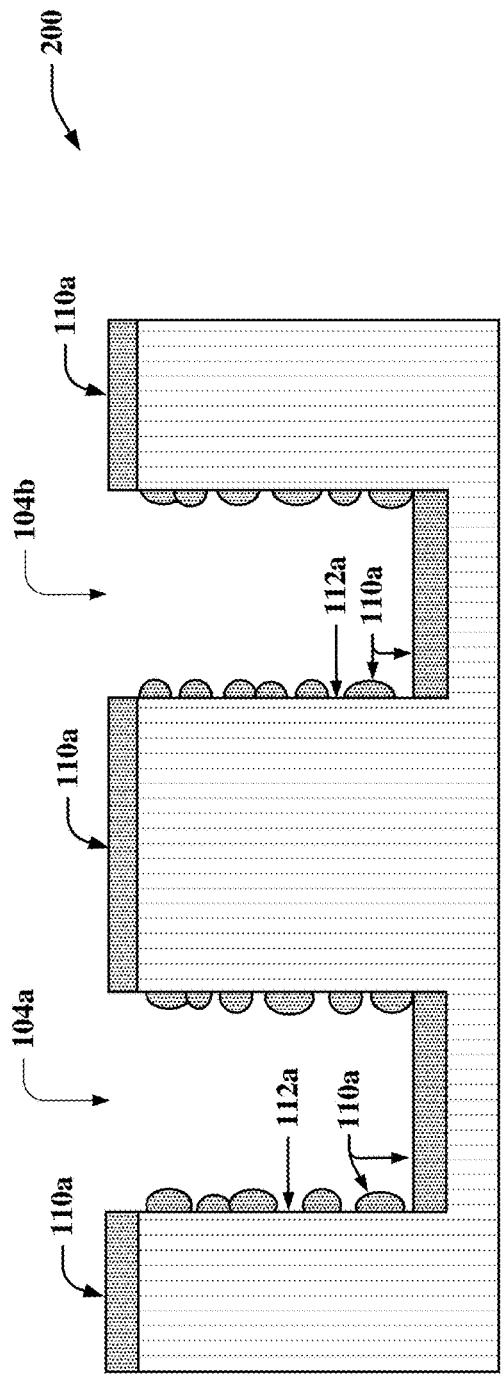
FIG. 2 illustrates a cross-sectional side view of an example, non-limiting device that can facilitate hybrid sidewall barrier and low resistance interconnect components in accordance with one or more embodiments described herein.

FIG. 2 illustrates a cross-sectional side view of an example, non-limiting device 200 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, device 200 can comprise an alternative embodiment of device 100. In such embodiments, device 200 can comprise an alternative embodiment of device 100 after formation of a discontinuous barrier liner 110a (e.g., including semi-spherical formations described below) and/or one or more sections 112a on sidewalls 106a, 106b and/or bottom surfaces 108a, 108b of openings 104a, 104b.

According to multiple embodiments, discontinuous barrier liner 110a can be coupled to physically exposed surfaces of interconnect material layer 102a and/or openings 104a, 104b, and if applicable, a physically exposed portion of an underlying base substrate (e.g., the base substrate described above with reference to FIG. 1). For example, discontinuous barrier liner 110a can be coupled to a top surface of interconnect material layer 102a, sidewalls 106a, 106b, and/or bottom surfaces 108a, 108b of openings 104a, 104b (e.g., as depicted in FIG. 2).

In some embodiments, discontinuous barrier liner 110a can be coupled (e.g., electrically, chemically, mechanically, etc.) to sidewalls 106a, 106b such that discontinuous barrier liner 110a forms a discontinuous liner on sidewalls 106a, 106b. For example, in some embodiments, discontinuous barrier liner 110a can be deposited onto sidewalls 106a, 106b such that discontinuous barrier liner 110a forms one or more semi-spherical formations (e.g., islands of discontinuous barrier liner 110a material) on sidewalls 106a, 106b (e.g., as depicted in FIG. 2). In some embodiments, such semi-spherical formations constituting discontinuous barrier liner 110a formed on sidewalls 106a, 106b can be spaced apart from one another at various distances (e.g., as depicted in FIG. 2), thereby resulting in one more sections 112a along sidewalls 106a, 106b that do not have discontinuous barrier liner 110a coupled thereto. In these embodiments, sections 112a can constitute exposed surfaces of sidewalls 106a, 106b.

In some embodiments, discontinuous barrier liner 110a can be formed on sidewalls 106a, 106b and/or bottom surfaces 108a, 108b (e.g., chemically and/or mechanically coupled to sidewalls 106a, 106b and/or bottom surfaces 108a, 108b) utilizing one or more deposition processes. For example, discontinuous barrier liner 110a can be formed on sidewalls 106a, 106b and/or bottom surfaces 108a, 108b by employing one or more deposition processes including, but not limited to, physical vapor deposition (PVD), chemical vapor deposition (CVD), atomic layer deposition (ALD), plasma enhanced chemical vapor deposition (PECVD), sputtering, chemical solution deposition, plating, and/or another deposition process. In some embodiments, discontinuous barrier liner 110a can be formed on sidewalls 106a, 106b and/or bottom surfaces 108a, 108b by employing physical vapor deposition (PVD), which can facilitate formation of the discontinuous character of discontinuous barrier liner 110a (e.g., the semi-spherical formations of discontinuous barrier liner 110a described above).

In some embodiments, discontinuous barrier liner 110a can comprise a diffusion barrier material (or stack of diffusion barrier materials) that can serve as a barrier to prevent a conductive material from diffusing through discontinuous barrier liner 110a. For example, discontinuous barrier liner 110a can comprise diffusion barrier materials (or stack of diffusion barrier materials) including, but not limited to, tantalum (Ta), tantalum nitride (TaN), tantalum tungsten (TaW), tantalum titanium (TaTi), tantalum niobium (TaNb), titanium (Ti), titanium nitride (TiN), tungsten (W), tungsten nitride (WN), and/or another diffusion barrier material.

In some embodiments, discontinuous barrier liner 110a can comprise any thickness that does not result in discontinuous barrier liner 110a filling the entirety of openings 104a, 104b. For example, discontinuous barrier liner 110a can comprise a thickness ranging from approximately 0.5 nm to 50 nm.

FIG. 3 illustrates a cross-sectional side view of an example, non-limiting device 300 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, device 300 can comprise an alternative embodiment of device 200. In such embodiments, device 300 can comprise an alternative embodiment of device 200 after formation of a continuous barrier layer 114a on discontinuous barrier liner 110a and/or one or more sections 112a of sidewalls 106a, 106b.

According to multiple embodiments, continuous barrier layer 114a can be coupled (e.g., electrically, chemically, mechanically, etc.) to physically exposed surfaces of discontinuous barrier liner 110a and/or one or more sections 112a of sidewalls 106a, 106b. For example, continuous barrier layer 114a can be deposited onto discontinuous barrier liner 110a and/or sections 112a of sidewalls 106a, 106b such that continuous barrier layer 114a forms a continuous layer enclosing the semi-spherical formations of discontinuous barrier liner 110a formed on sidewalls 106a, 106b and/or sections 112a of sidewalls 106a, 106b, as well as a portion of discontinuous barrier liner 110a coupled to bottom surfaces 108a, 108b. It should be appreciated that formation of continuous barrier layer 114a onto discontinuous barrier liner 110a and/or sections 112a of sidewalls 106a, 106b as described above can facilitate formation of a hybrid sidewall barrier structure.

In some embodiments, continuous barrier layer 114a can comprise a conformal layer. As referenced herein, "conformal" can describe a material that has a thickness as measured vertically from a bottommost surface to a topmost surface that is the same as a thickness as measured horizontally from an inner sidewall surface to an outer sidewall surface.

In some embodiments, continuous barrier layer 114a can be formed on discontinuous barrier liner 110a (e.g., including the semi-spherical formations of discontinuous barrier liner 110a described above) and/or sections 112a of sidewalls 106a, 106b utilizing one or more deposition processes. For example, continuous barrier layer 114a can be formed on (e.g., chemically and/or mechanically coupled to) discontinuous barrier liner 110a (e.g., including the semi-spherical formations of discontinuous barrier liner 110a described above) and/or sections 112a of sidewalls 106a, 106b by employing one or more deposition processes including, but not limited to, physical vapor deposition (PVD), chemical vapor deposition (CVD), atomic layer deposition (ALD), plasma enhanced chemical vapor deposition (PECVD), sputtering, chemical solution deposition, plating, and/or another deposition process. In some embodiments, continuous barrier layer 114a can be formed on (e.g., chemically and/or mechanically coupled to) discontinuous barrier liner 110a (e.g., including the semi-spherical formations of discontinuous barrier liner 110a described above) and/or sections 112a of sidewalls 106a, 106b by employing atomic layer deposition (ALD), which can facilitate formation of the continuous character (e.g., conformal character) of continuous barrier layer 114a.

In some embodiments, continuous barrier layer 114a can comprise a diffusion barrier material (or stack of diffusion barrier materials) that can serve as a barrier to prevent a conductive material from diffusing through continuous barrier layer 114a. For example, continuous barrier layer 114a can comprise diffusion barrier materials (or stack of diffusion barrier materials) including, but not limited to, tantalum (Ta), tantalum nitride (TaN), tantalum tungsten (TaW), tantalum titanium (TaTi), tantalum niobium (TaNb), titanium (Ti), titanium nitride (TiN), tungsten (W), tungsten nitride (WN), niobium nitride (NbN) and/or another diffusion barrier material.

In some embodiments, continuous barrier layer 114a can comprise any thickness that does not result in continuous barrier layer 114a filling the entirety of openings 104a, 104b. For example, continuous barrier layer 114a can comprise a thickness ranging from approximately 0.5 nm to 50 nm.

FIG. 4 illustrates a cross-sectional side view of an example, non-limiting device 400 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, device 400 can comprise an alternative embodiment of device 300. In such embodiments, device 400 can comprise an alternative embodiment of device 300 after removing continuous barrier layer 114a from horizontal surfaces of discontinuous barrier liner 110a, while maintaining a portion of continuous barrier layer 114a on vertical surfaces of discontinuous barrier liner 110a (e.g., the semi-spherical formations of discontinuous barrier liner 110a as described above) and/or sections 112a of sidewalls 106a, 106b. In these embodiments, removing continuous barrier layer 114a from horizontal surfaces of discontinuous barrier liner 110a as described above can physically expose a top horizontal surface of such portions of discontinuous barrier liner 110a from which continuous barrier layer 114a has been removed (e.g., as depicted in FIG. 4).

According to multiple embodiments, portions of continuous barrier layer 114a formed on discontinuous barrier liner 110a can be removed from portions of discontinuous barrier liner 110a (e.g., as described above and illustrated in FIG. 4) by employing a physical vapor deposition (PVD) etch-back process. For example, portions of continuous barrier layer 114a can be removed from portions of discontinuous barrier liner 110a (e.g., as described above and illustrated in FIG. 4) by employing an etching process including, but not limited to, reactive ion etching (RIE), dry etching, wet etching, ion beam etching, plasma etching, laser ablation, and/or another etching process.

Figure 5:
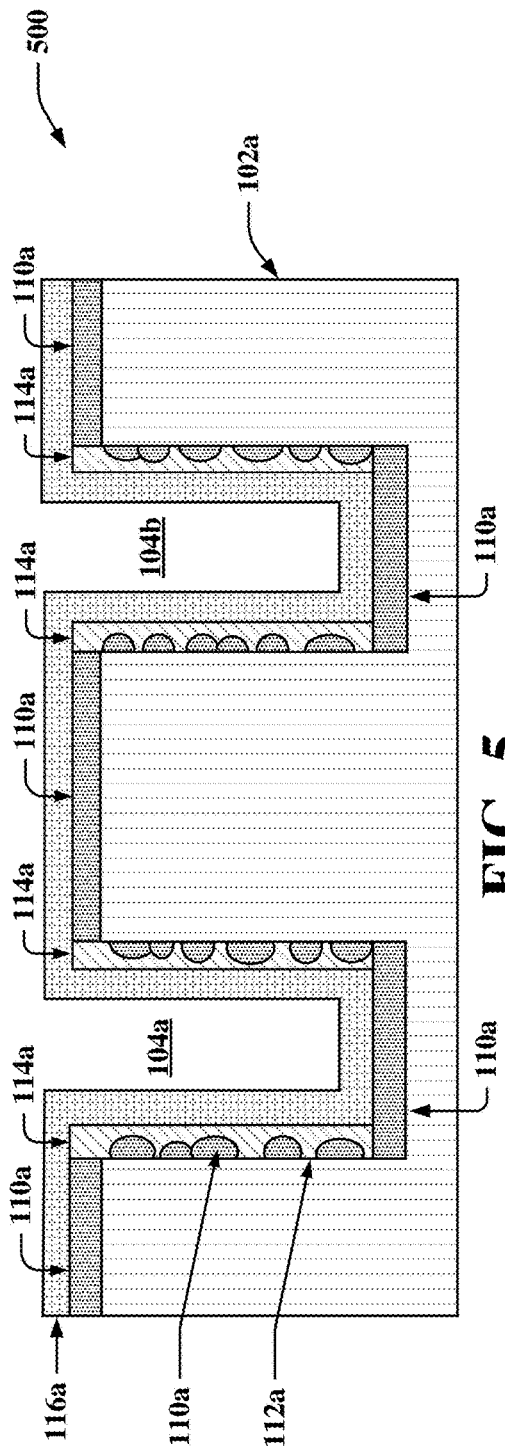
FIG. 5 illustrates a cross-sectional side view of an example, non-limiting device that can facilitate hybrid sidewall barrier and low resistance interconnect components in accordance with one or more embodiments described herein.

FIG. 5 illustrates a cross-sectional side view of an example, non-limiting device 500 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, device 500 can comprise an alternative embodiment of device 400. In such embodiments, device 500 can comprise an alternative embodiment of device 400 after formation of a seed enhancement liner 116a on physically exposed surfaces of discontinuous barrier liner 110a and continuous barrier layer 114a.

According to multiple embodiments, seed enhancement liner 116a can be coupled (e.g., electrically, chemically, mechanically, etc.) to physically exposed surfaces of discontinuous barrier liner 110a and/or continuous barrier layer 114a. For example, seed enhancement liner 116a can be deposited onto horizontal surfaces of discontinuous barrier liner 110a and/or vertical and horizontal surfaces of continuous barrier layer 114a such that seed enhancement liner 116a forms a continuous layer enclosing such surfaces of discontinuous barrier liner 110a and/or continuous barrier layer 114a (e.g., as illustrated in FIG. 5). In this example, seed enhancement liner 116a can comprise a conformal layer (e.g., as defined above).

In some embodiments, seed enhancement liner 116a can be formed on discontinuous barrier liner 110a and/or continuous barrier layer 114a utilizing one or more deposition processes. For example, seed enhancement liner 116a can be formed on (e.g., chemically and/or mechanically coupled to) discontinuous barrier liner 110a and/or continuous barrier layer 114a by employing one or more deposition processes including, but not limited to, physical vapor deposition (PVD), chemical vapor deposition (CVD), atomic layer deposition (ALD), plasma enhanced chemical vapor deposition (PECVD), sputtering, chemical solution deposition, plating, and/or another deposition process. In some embodiments, seed enhancement liner 116a can be formed on (e.g., chemically and/or mechanically coupled to) discontinuous barrier liner 110a and/or continuous barrier layer 114a by employing atomic layer deposition (ALD), which can facilitate formation of the continuous character (e.g., conformal character) of seed enhancement liner 116a.

In some embodiments, seed enhancement liner 116a can comprise any low resistance metal or metal alloy that can facilitate formation of an interconnect metal or metal alloy thereon. As referenced herein, "low resistance" can describe a metal or metal alloy having a resistivity of 15E-8 ohm-meter or less. In some embodiments, seed enhancement liner 116a can comprise a metal or metal alloy that can facilitate movement (e.g., flow) of an interconnect metal or metal alloy during a reflow anneal process. For example, seed enhancement liner 116a can comprise low resistance metals including, but not limited to ruthenium (Ru), rhodium (Rh), iridium (Ir), osmium (Os), cobalt (Co), and/or another low resistance metal. In another example, seed enhancement liner 116a can comprise low resistance metal alloys comprising at least one of ruthenium (Ru), rhodium (Rh), iridium (Ir), osmium (Os), and/or cobalt (Co), and/or another low resistance metal alloy. In some embodiments, seed enhancement liner 116a can comprise ruthenium (Ru) or cobalt (Co).

In some embodiments, seed enhancement liner 116a can comprise a single layer (e.g., as illustrated in FIG. 5) of one of the metals or metal alloys described above. In some embodiments, seed enhancement liner 116a can comprise a multi-layered stack (not illustrated in the figures) having at least a first layer of a first metal or metal alloy, and a second layer of a second metal or metal alloy, where the second metal or metal alloy differs in composition from the first metal or metal alloy.

In some embodiments, seed enhancement liner 116a can comprise any thickness that does not result in seed enhancement liner 116a filling the entirety of openings 104a, 104b, and/or any thickness that when combined with the thicknesses of discontinuous barrier liner 110a and/or continuous barrier layer 114a, does not result in seed enhancement liner 116a filling the entirety of openings 104a, 104b. For example, seed enhancement liner 116a can comprise a thickness ranging from approximately 1 nm to 80 nm.

Figure 6:
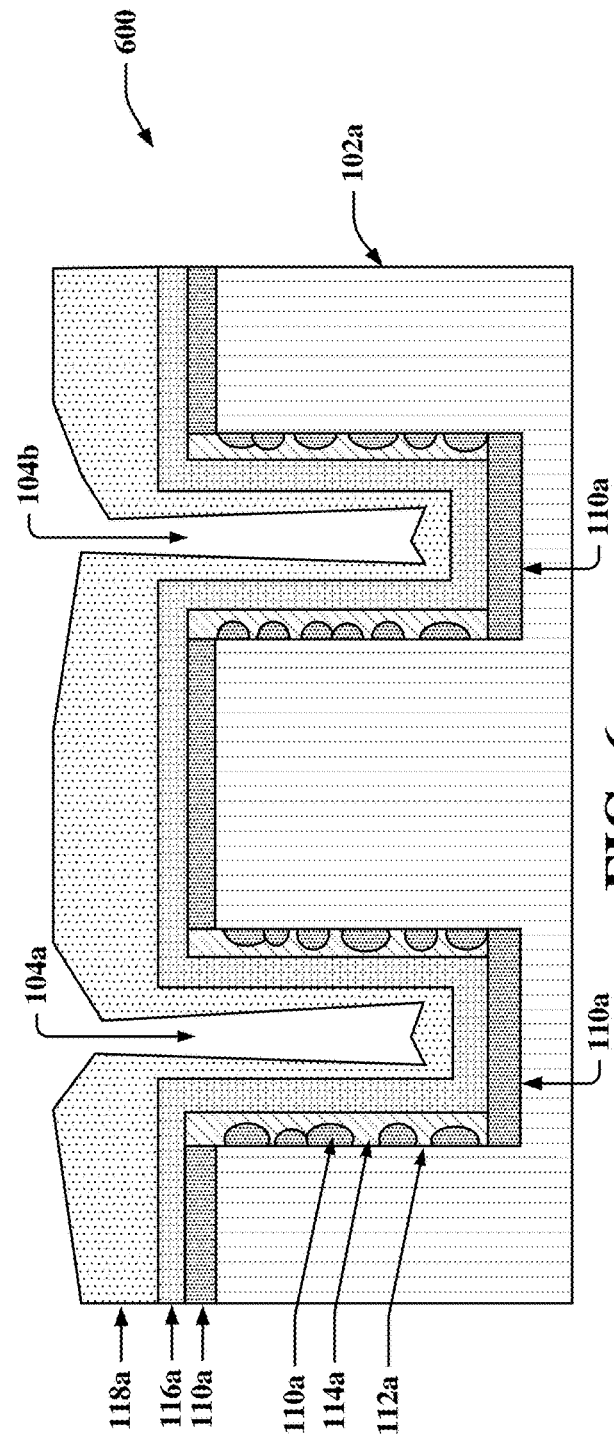
FIG. 6 illustrates a cross-sectional side view of an example, non-limiting device that can facilitate hybrid sidewall barrier and low resistance interconnect components in accordance with one or more embodiments described herein.

FIG. 6 illustrates a cross-sectional side view of an example, non-limiting device 600 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, device 600 can comprise an alternative embodiment of device 500. In such embodiments, device 600 can comprise an alternative embodiment of device 500 after formation of an interconnect metallic layer 118a on physically exposed surfaces of seed enhancement liner 116a.

According to multiple embodiments, interconnect metallic layer 118a can be coupled (e.g., electrically, chemically, mechanically, etc.) to physically exposed surfaces of seed enhancement liner 116a. For example, interconnect metallic layer 118a can be deposited onto horizontal and vertical surfaces of seed enhancement liner 116a such that interconnect metallic layer 118a forms a continuous layer enclosing such surfaces of seed enhancement liner 116a (e.g., as illustrated in FIG. 6).

In some embodiments, interconnect metallic layer 118a can comprise a seed layer. For example, interconnect metallic layer 118a can comprise an interconnect metallic seed layer. As referenced herein, a "seed layer" can describe a catalyst layer that facilitates optimized nucleation and/or growth direction of a material formed thereon.

In some embodiments, interconnect metallic layer 118a can comprise a non-conformal layer that does not fill in the entirety of the remaining volume of openings 104a, 104b (e.g., as illustrated in FIG. 6). In such embodiments, the thickness of interconnect metallic layer 118a along horizontal surfaces of seed enhancement liner 116a can be greater than the thickness of interconnect metallic layer 118a along vertical surfaces of seed enhancement liner 116a (e.g., as illustrated in FIG. 6).

In some embodiments, interconnect metallic layer 118a can comprise any interconnect metal including, but not limited to, copper (Cu), aluminum (Al), and/or another interconnect metal. In some embodiments, interconnect metallic layer 118a can comprise an interconnect metal alloy such as, for example, a copper-aluminum alloy, where in some embodiments, the copper-aluminum alloy can comprise a higher content of copper than aluminum, and in other embodiments contain a higher content of aluminum than copper. In some embodiments, interconnect metallic layer 118a can comprise copper (Cu) or a copper-aluminum alloy.

In some embodiments, interconnect metallic layer 118a can be formed on seed enhancement liner 116a utilizing one or more deposition processes. For example, interconnect metallic layer 118a can be formed on (e.g., chemically and/or mechanically coupled to) seed enhancement liner 116a by employing one or more deposition processes including, but not limited to, physical vapor deposition (PVD), chemical vapor deposition (CVD), plasma enhanced chemical vapor deposition (PECVD), sputtering, chemical solution deposition, plating, and/or another deposition process.

FIG. 7 illustrates a cross-sectional side view of an example, non-limiting device 700 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, device 700 can comprise an alternative embodiment of device 600. In such embodiments, device 700 can comprise an alternative embodiment of device 600 after filling openings 104a, 104b with an interconnect metallic material 120a and forming an interconnect metallic material overburden 122a.

According to some embodiments, interconnect metallic material 120a can be formed within openings 104a, 104b such that interconnect metallic material 120a fills the remaining volume of openings 104a, 104b after forming discontinuous barrier liner 110a, continuous barrier layer 114a, seed enhancement liner 116a, and interconnect metallic layer 118a. In some embodiments, interconnect metallic material 120a can be formed by employing a fill process such as, for example, electroplating to fill the remaining volume of openings 104a, 104b with an interconnect metal or metal alloy, and form an overburden (e.g., interconnect metallic material overburden 122a) of the interconnect metal or metal alloy outside openings 104a, 104b (e.g., as illustrated in FIG. 7).

In some embodiments, interconnect metallic material 120a can be formed by employing a bottom-up plating process to fill openings 104a, 104b with an interconnect metal or metal alloy (e.g., copper (Cu), aluminum (Al), a copper alloy, an aluminum alloy, a copper-aluminum alloy, etc.). In some embodiments, interconnect metallic material 120a can be formed by performing a reflow anneal process (not depicted in FIG. 7). In such embodiments, the reflow anneal can be employed to cause the interconnect metal or metal alloy of interconnect metallic layer 118a to flow into openings 104a, 104b, thereby filling the remaining volume of openings 104a, 104b with the interconnect metal or metal alloy to form interconnect metallic material 120a and interconnect metallic material overburden 122a.

In some embodiments, the reflow anneal can comprise a thermal anneal. For example, the reflow anneal can comprise a furnace anneal or a hot plate anneal. In some embodiments, the reflow anneal can be performed at a temperature ranging from approximately 100 degrees Celsius (100° C.) to 500° C. In some embodiments, other temperatures can be employed such that the selected reflow anneal temperature causes the reflow of the interconnect metal or metal alloy of interconnect metallic layer 118a. In some embodiments, the duration of the reflow anneal can vary depending upon the temperature used during the thermal anneal. For example, for a temperature ranging from 100° C. to 500° C., the reflow anneal can be performed for a duration of 30 seconds to 3 hours. In some embodiments, the reflow anneal can be performed in a nitrogen-containing ambient or a hydrogen-containing ambient. For example, such nitrogen-containing ambients that can be employed can include, but are not limited to, dinitrogen ($N_2$), ammonia ($NH_3$), and/or mixtures thereof. In some embodiments, the nitrogen-containing ambient can be used neat (e.g., non-diluted). In some embodiments, the nitrogen-containing ambient can be diluted with an inert gas such as, for example, helium (He), neon (Ne), argon (Ar), and/or mixtures thereof. In some embodiments, hydrogen ($H_2$) can be used to dilute the nitrogen-containing ambient. In some embodiments, notwithstanding whether the nitrogen-containing ambient is employed neat or diluted, the content of nitrogen within the nitrogen-containing ambient that can be employed to fabricate various embodiments of the subject disclosure can range from approximately 10 percent (10%) to 100%. For example, a nitrogen content within the nitrogen-containing ambient ranging from approximately 50% to 80% can be employed to fabricate various embodiments of the subject disclosure.

In some embodiments, interconnect metallic material 120a and/or interconnect metallic material overburden 122a can comprise an interconnect metal or metal alloy. For example, interconnect metallic material 120a and/or interconnect metallic material overburden 122a can comprise an interconnect metal or metal alloy such as, for example, copper (Cu), aluminum (Al), a copper alloy, an aluminum alloy, a copper-aluminum alloy, and/or another interconnect metal or metal alloy.

FIG. 8 illustrates a cross-sectional side view of an example, non-limiting device 800 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, device 800 can comprise an alternative embodiment of device 700. In such embodiments, device 800 can comprise an alternative embodiment of device 700 after: removal of interconnect metallic material overburden 122a, as well as portions of interconnect metallic material 120a, seed enhancement liner 116a, continuous barrier layer 114a, and/or discontinuous barrier liner 110a; and/or formation of a cap layer 124a on interconnect material layer 102a.

According to multiple embodiments, interconnect metallic material overburden 122a, as well as portions of interconnect metallic material 120a, seed enhancement liner 116a, continuous barrier layer 114a, and/or discontinuous barrier liner 110a can be removed from device 700 to form device 800. For example, interconnect metallic material overburden 122a, as well as portions of interconnect metallic material 120a, seed enhancement liner 116a, continuous barrier layer 114a, and/or discontinuous barrier liner 110a can be removed from device 700 by performing a planarization process including, but not limited to, chemical-mechanical polishing (CMP), backgrinding, and/or another planarization process. In some embodiments, one or more such planarization processes can be performed to remove all material present outside openings 104a, 104b and all material located above the topmost surface of interconnect material layer 102a. In such embodiments, employing one or more such planarization processes can remove all of interconnect metallic material overburden 122a, as well as some portions of interconnect metallic material 120a, seed enhancement liner 116a, continuous barrier layer 114a, and/or discontinuous barrier liner 110a (e.g., as illustrated in FIG. 8).

According to multiple embodiments, cap layer 124a can be coupled (e.g., electrically, chemically, mechanically, etc.) to surfaces of device 700 physically exposed by performing one or more planarization processes described above. For example, cap layer 124a can be coupled (e.g., electrically, chemically, mechanically, etc.) to surfaces of discontinuous barrier liner 110a (e.g., the semi-spherical formations of discontinuous barrier liner 110a exposed by performing one or more planarization processes), continuous barrier layer 114a, seed enhancement liner 116a, and/or interconnect metallic material 120a.

In some embodiments, cap layer 124a can be formed on surfaces of discontinuous barrier liner 110a (e.g., the semi-spherical formations of discontinuous barrier liner 110a exposed by performing one or more planarization processes), continuous barrier layer 114a, seed enhancement liner 116a, and/or interconnect metallic material 120a utilizing one or more deposition processes. For example, cap layer 124a can be formed on surfaces of discontinuous barrier liner 110a (e.g., the semi-spherical formations of discontinuous barrier liner 110a exposed by performing one or more planarization processes), continuous barrier layer 114a, seed enhancement liner 116a, and/or interconnect metallic material 120a by employing one or more deposition processes including, but not limited to, physical vapor deposition (PVD), chemical vapor deposition (CVD), atomic layer deposition (ALD), plasma enhanced chemical vapor deposition (PECVD), sputtering, chemical solution deposition, plating, and/or another deposition process. In some embodiments, the formation of cap layer 124a can be omitted.

In some embodiments, cap layer 124a can comprise a dielectric material. For example, cap layer 124a can comprise a dielectric material including, but not limited to, silicon carbide (SiC), silicon nitride ($Si_3N_4$), silicon dioxide ($SiO_2$), a carbon doped oxide, a nitrogen and hydrogen doped silicon carbide (SiC(N,H)), a multi-layered stack of at least one of the aforementioned dielectric materials, and/or another dielectric material or stack thereof.

In some embodiments, cap layer 124a can comprise a thickness that can vary depending upon the type of dielectric material used. For example, cap layer 124a can be ground (e.g., via backgrinding) to a thickness (e.g., height) ranging from 10 nm to 100 nm. In some embodiments, cap layer 124a can comprise a thickness that is less than 10 nm or greater than 100 nm.

Figure 9:
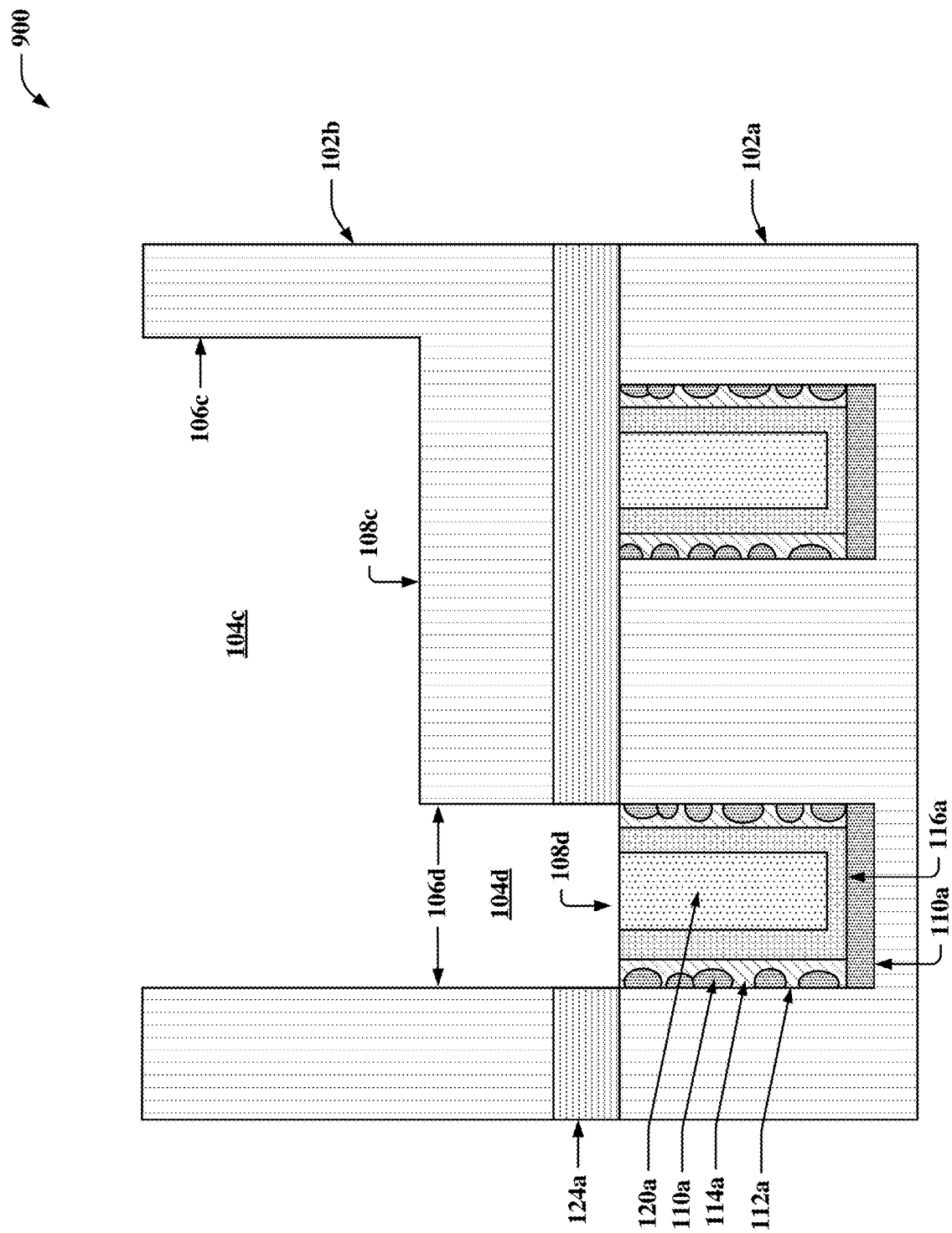
FIG. 9 illustrates a cross-sectional side view of an example, non-limiting interconnect device that can facilitate hybrid sidewall barrier and low resistance interconnect components in accordance with one or more embodiments described herein.

FIG. 9 illustrates a cross-sectional side view of an example, non-limiting interconnect device 900 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, interconnect device 900 can comprise an alternative embodiment of device 800. In such embodiments, interconnect device 900 can comprise an alternative embodiment of device 800 after formation of: a second interconnect material layer 102b on cap layer 124b; and one or more openings 104c, 104d into interconnect material layer 102b and cap layer 124b. In some embodiments, one or more elements and/or processes described below with reference to FIGS. 9-18 may be omitted.

In some embodiments, interconnect material layer 102b can be coupled (e.g., electrically, chemically, mechanically, etc.) to cap layer 124a by employing one or more deposition processes described above (e.g., PVD, CVD, ALD, PECVD, sputtering, chemical solution deposition, plating, etc.) to form interconnect material layer 102b on cap layer 124a. In some embodiments in which cap layer 124a is omitted (not illustrated in the figures), interconnect material layer 102b can be formed on surfaces of device 700 physically exposed by performing one or more planarization processes described above with reference to FIG. 7. For example, in some embodiments in which cap layer 124a is omitted, interconnect material layer 102b can be formed on surfaces of discontinuous barrier liner 110a (e.g., the semi-spherical formations of discontinuous barrier liner 110a exposed by performing one or more planarization processes), continuous barrier layer 114a, seed enhancement liner 116a, and/or interconnect metallic material 120a.

In some embodiments, interconnect material layer 102b can comprise the same material (e.g., dielectric material) that can be used to form interconnect material layer 102a as described above with reference to FIG. 1. In some embodiments, interconnect material layer 102b can comprise material that is different from the material that can be used to form interconnect material layer 102a described above with reference to FIG. 1. In some embodiments, interconnect material layer 102b can comprise a thickness within the range described above with reference to interconnect material layer 102a and FIG. 1 (e.g., interconnect material layer 102b can be ground via backgrinding to a thickness ranging from 20 nm to 1000 nm). In some embodiments, interconnect material layer 102b can constitute an interconnect material layer of a multi-layered interconnect device (e.g., as illustrated in the embodiment depicted in FIG. 16).

According to multiple embodiments, one or more openings 104c, 104d can be formed into interconnect material layer 102b and/or cap layer 124a. For example, openings 104c, 104d can be formed utilizing a patterning process described above with reference to FIG. 1 to form openings 104a, 104b (e.g., via lithographic and etching techniques).

In some embodiments, opening 104c can extend only partially through interconnect material layer 102b (e.g., as illustrated in FIG. 9), thereby exposing a sub-surface portion (e.g., as defined above) of interconnect material layer 102b. For example, as depicted in FIG. 9, opening 104c can extend only partially through interconnect material layer 102b, thereby exposing bottom surface 108c of opening 104c. In some embodiments, opening 104c can comprise sidewalls 106c, 106d (e.g., vertical sidewalls as depicted in FIG. 9). In some embodiments, sidewalls 106c, 106d and/or bottom surface 108c can comprise physically exposed surfaces of interconnect material layer 102b and/or cap layer 124a.

In some embodiments, opening 104d can extend entirely through interconnect material layer 102b and/or cap layer 124a. In such embodiments, opening 104d can physically expose a top surface of discontinuous barrier liner 110a (e.g., the semi-spherical formations of discontinuous barrier liner 110a exposed by performing one or more planarization processes), continuous barrier layer 114a, seed enhancement liner 116a, and/or interconnect metallic material 120a. In these embodiments, such top surfaces of discontinuous barrier liner 110a (e.g., the semi-spherical formations of discontinuous barrier liner 110a exposed by performing one or more planarization processes), continuous barrier layer 114a, seed enhancement liner 116a, and/or interconnect metallic material 120a can constitute a bottom surface 108d of opening 104d (e.g., a horizontal bottom surface as depicted in FIG. 9). In some embodiments, opening 104d can comprise sidewalls 106d (e.g., vertical sidewalls as depicted in FIG. 9). In some embodiments, sidewalls 106d can comprise physically exposed surfaces of interconnect material layer 102b and/or cap layer 124a.

Although interconnect device 900 illustrated in FIG. 9 depicts two openings 104c, 104d, the subject disclosure is not so limited. For example, in some embodiments, interconnect material layer 102b can comprise a single opening formed therein. In another example, interconnect material layer 102b can comprise a plurality of openings formed therein.

In some embodiments, openings 104c, 104d can comprise a via opening, a line opening, and/or a combined via/line opening (e.g., as defined above) formed in interconnect material layer 102b. For example, a combined via/line opening can be formed in interconnect material layer 102b, where such a via opening can be formed first and a line opening can be formed atop and in communication (e.g., electrically, physically, etc.) with the via opening. In another example, a combined via/line opening can be formed in interconnect material layer 102b, where such a line opening can be formed first and then a via opening can be formed atop and in communication (e.g., electrically, physically, etc.) with the line opening. In FIG. 9, and by way of an example, openings 104c, 104d comprise a combined via/line opening. In some embodiments, such a combined via/line opening can be formed in interconnect material layer 102b by employing a dual damascene process (e.g., including at least one iteration of the lithography and etching steps described above).

Figure 10:
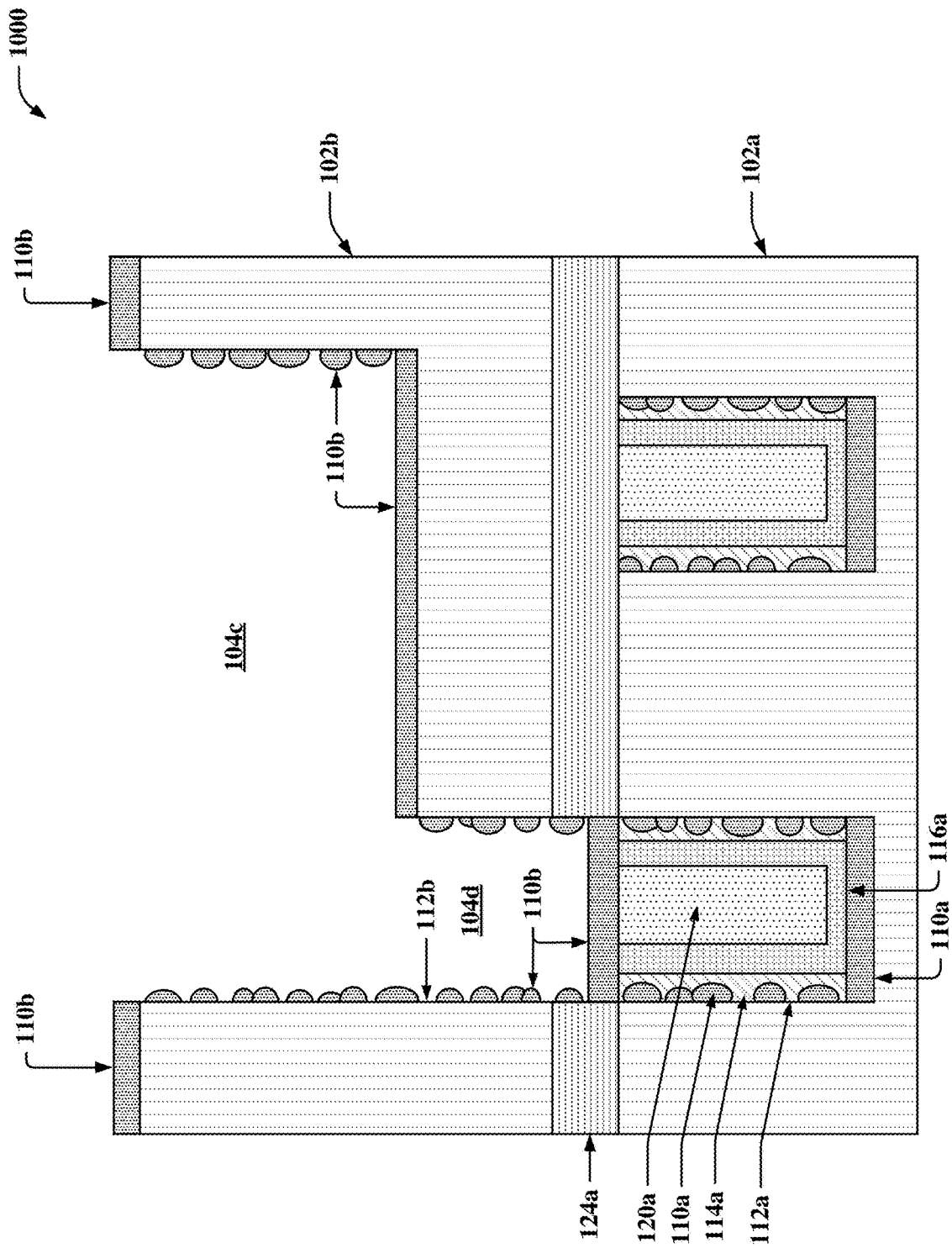
FIG. 10 illustrates a cross-sectional side view of an example, non-limiting interconnect device that can facilitate hybrid sidewall barrier and low resistance interconnect components in accordance with one or more embodiments described herein.

FIG. 10 illustrates a cross-sectional side view of an example, non-limiting interconnect device 1000 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, interconnect device 1000 can comprise an alternative embodiment of interconnect device 900. In such embodiments, interconnect device 1000 can comprise an alternative embodiment of interconnect device 900 after formation of a discontinuous barrier liner 110b (e.g., including semi-spherical formations described below) and/or one or more sections 112b on sidewalls 106c, 106d and/or bottom surfaces 108c, 108d of openings 104c, 104d.

According to multiple embodiments, discontinuous barrier liner 110b can be coupled to physically exposed surfaces of interconnect material layer 102b and/or openings 104c, 104d. For example, discontinuous barrier liner 110b can be coupled to a top surface of interconnect material layer 102b, sidewalls 106c, 106d, and/or bottom surfaces 108c, 108d of openings 104c, 104d (e.g., as depicted in FIG. 10).

In some embodiments, discontinuous barrier liner 110b can be coupled (e.g., electrically, chemically, mechanically, etc.) to sidewalls 106c, 106d such that discontinuous barrier liner 110b forms a discontinuous liner on sidewalls 106c, 106d. For example, in some embodiments, discontinuous barrier liner 110b can be deposited onto sidewalls 106c, 106d such that discontinuous barrier liner 110b forms one or more semi-spherical formations (e.g., islands of discontinuous barrier liner 110b material) on sidewalls 106c, 106d (e.g., as depicted in FIG. 10). In some embodiments, such semi-spherical formations constituting discontinuous barrier liner 110b formed on sidewalls 106c, 106d can be spaced apart from one another at various distances (e.g., as depicted in FIG. 10), thereby resulting in one more sections 112b along sidewalls 106c, 106d that do not have discontinuous barrier liner 110b coupled thereto. In these embodiments, sections 112b can constitute exposed surfaces of sidewalls 106c, 106d.

In some embodiments, discontinuous barrier liner 110b can be formed on sidewalls 106c, 106d and/or bottom surfaces 108c, 108d (e.g., chemically and/or mechanically coupled to sidewalls 106c, 106d and/or bottom surfaces 108c, 108d) utilizing one or more deposition processes described above with reference to discontinuous barrier liner 110a and FIG. 2 (e.g., PVD, CVD, ALD, PECVD, sputtering, chemical solution deposition, plating, etc.). In some embodiments, discontinuous barrier liner 110b can be formed on sidewalls 106c, 106d and/or bottom surfaces 108c, 108d by employing physical vapor deposition (PVD), which can facilitate formation of the discontinuous character of discontinuous barrier liner 110b (e.g., the semi-spherical formations of discontinuous barrier liner 110b described above).

In some embodiments, discontinuous barrier liner 110b can comprise the same material (e.g., diffusion barrier material or a stack of diffusion barrier materials) that can be used to form discontinuous barrier liner 110a as described above with reference to FIG. 2 (e.g., tantalum nitride (TaN)). In some embodiments, discontinuous barrier liner 110b can comprise material that is different from the material that can be used to form discontinuous barrier liner 110a described above with reference to FIG. 2.

In some embodiments, discontinuous barrier liner 110b can comprise any thickness that does not result in discontinuous barrier liner 110b filling the entirety of openings 104c, 104d. For example, discontinuous barrier liner 110b can comprise a thickness ranging from approximately 0.5 nm to 50 nm.

Figure 11:
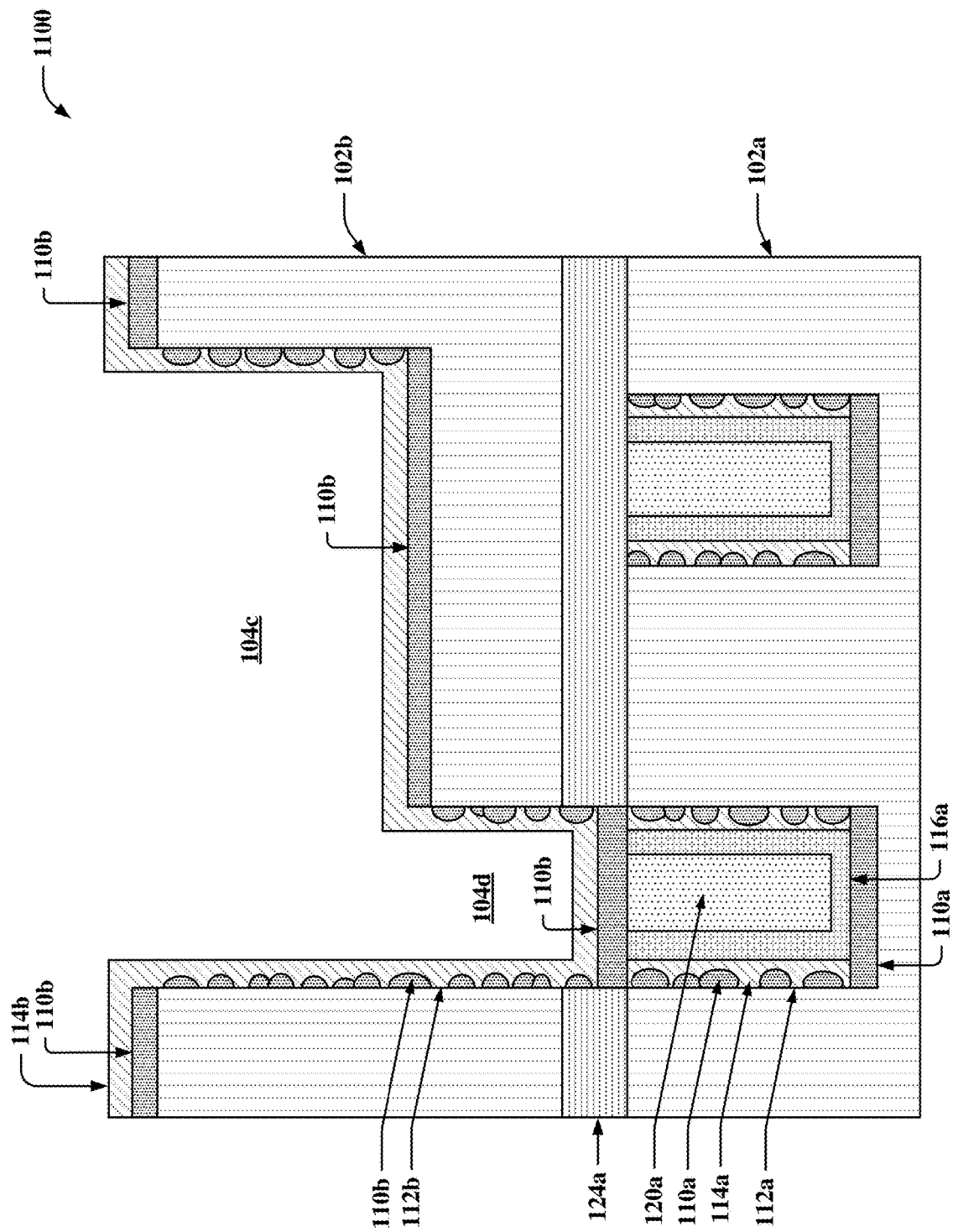
FIG. 11 illustrates a cross-sectional side view of an example, non-limiting interconnect device that can facilitate hybrid sidewall barrier and low resistance interconnect components in accordance with one or more embodiments described herein.

FIG. 11 illustrates a cross-sectional side view of an example, non-limiting interconnect device 1100 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, interconnect device 1100 can comprise an alternative embodiment of interconnect device 1000. In such embodiments, interconnect device 1100 can comprise an alternative embodiment of interconnect device 1000 after formation of a continuous barrier layer 114b on discontinuous barrier liner 110b and/or one or more sections 112b of sidewalls 106c, 106d.

According to multiple embodiments, continuous barrier layer 114b can be coupled (e.g., electrically, chemically, mechanically, etc.) to physically exposed surfaces of discontinuous barrier liner 110b and/or one or more sections 112b of sidewalls 106c, 106d. For example, continuous barrier layer 114b can be deposited onto discontinuous barrier liner 110b and/or sections 112b of sidewalls 106c, 106d such that continuous barrier layer 114b forms a continuous layer enclosing the semi-spherical formations of discontinuous barrier liner 110b formed on sidewalls 106c, 106d and/or sections 112b of sidewalls 106c, 106d, as well as a portion of discontinuous barrier liner 110b coupled to bottom surfaces 108c, 108d. In some embodiments, continuous barrier layer 114b can comprise a conformal layer (e.g., as defined above). It should be appreciated that formation of continuous barrier layer 114b onto discontinuous barrier liner 110b and/or sections 112b of sidewalls 106c, 106d as described above can facilitate formation of a hybrid sidewall barrier structure.

In some embodiments, continuous barrier layer 114b can be formed on discontinuous barrier liner 110b (e.g., including the semi-spherical formations of discontinuous barrier liner 110b described above) and/or sections 112b of sidewalls 106c, 106d utilizing one or more deposition processes described above with reference to continuous barrier layer 114a and FIG. 3 (e.g., PVD, CVD, ALD, PECVD, sputtering, chemical solution deposition, plating, etc.). In some embodiments, continuous barrier layer 114b can be formed on (e.g., chemically and/or mechanically coupled to) discontinuous barrier liner 110b (e.g., including the semi-spherical formations of discontinuous barrier liner 110b described above) and/or sections 112b of sidewalls 106c, 106d by employing atomic layer deposition (ALD), which can facilitate formation of the continuous character (e.g., conformal character) of continuous barrier layer 114b.

In some embodiments, continuous barrier layer 114b can comprise the same material (e.g., diffusion barrier material or a stack of diffusion barrier materials) that can be used to form continuous barrier layer 114a as described above with reference to FIG. 3 (e.g., tantalum nitride (TaN)). In some embodiments, continuous barrier layer 114b can comprise material that is different from the material that can be used to form continuous barrier layer 114a described above with reference to FIG. 3.

In some embodiments, continuous barrier layer 114b can comprise any thickness that does not result in continuous barrier layer 114b filling the entirety of openings 104c, 104d. For example, continuous barrier layer 114b can comprise a thickness ranging from approximately 0.5 nm to 50 nm.

Figure 12:
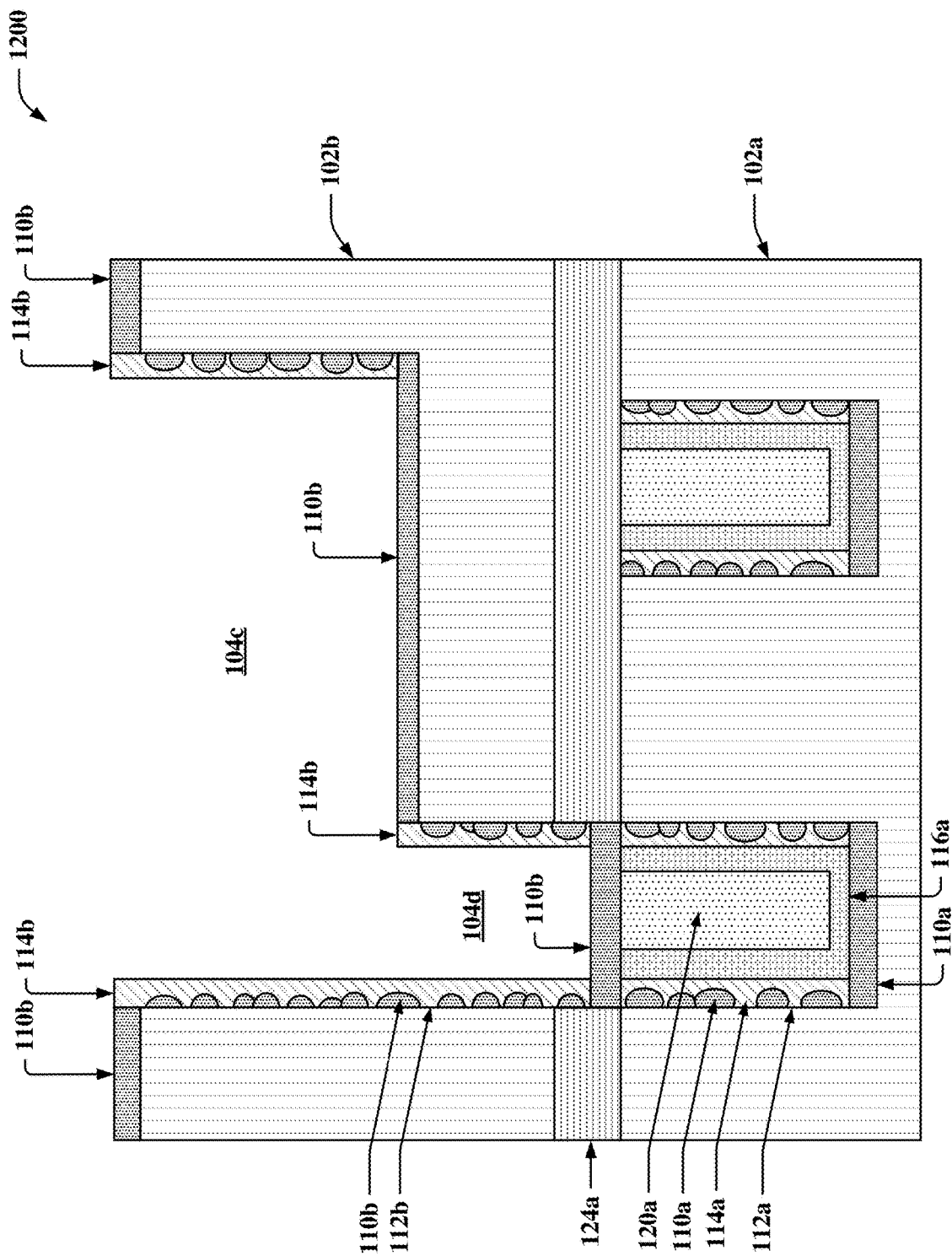
FIG. 12 illustrates a cross-sectional side view of an example, non-limiting interconnect device that can facilitate hybrid sidewall barrier and low resistance interconnect components in accordance with one or more embodiments described herein.

FIG. 12 illustrates a cross-sectional side view of an example, non-limiting interconnect device 1200 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, interconnect device 1200 can comprise an alternative embodiment of interconnect device 1100. In such embodiments, interconnect device 1200 can comprise an alternative embodiment of interconnect device 1100 after removing continuous barrier layer 114b from horizontal surfaces of discontinuous barrier liner 110b, while maintaining a portion of continuous barrier layer 114b on vertical surfaces of discontinuous barrier liner 110b (e.g., the semi-spherical formations of discontinuous barrier liner 110b as described above) and/or sections 112b of sidewalls 106c, 106d. In these embodiments, removing continuous barrier layer 114b from horizontal surfaces of discontinuous barrier liner 110b as described above can physically expose a top horizontal surface of such portions of discontinuous barrier liner 110b from which continuous barrier layer 114b has been removed (e.g., as depicted in FIG. 12).

According to multiple embodiments, portions of continuous barrier layer 114b formed on discontinuous barrier liner 110b can be removed from portions of discontinuous barrier liner 110*b* (e.g., as described above and illustrated in FIG. 12) by employing a physical vapor deposition (PVD) etchback process. For example, portions of continuous barrier layer 114*b* can be removed from portions of discontinuous barrier liner 110*b* (e.g., as described above and illustrated in FIG. 12) by employing an etching process including, but not limited to, reactive ion etching (RIE), dry etching, wet etching, ion beam etching, plasma etching, laser ablation, and/or another etching process.

Additionally or alternatively, in some embodiments (not illustrated in the figures), discontinuous barrier liner 110*b* formed on bottom surface 108*d* of opening 104*d* can be partially or completely removed (e.g., via an etching process described above). In these embodiments, partial or complete removal of discontinuous barrier liner 110*b* formed on bottom surface 108*d* can provide an alternative example embodiment of interconnect device 1200, where such removal can expose surfaces of discontinuous barrier liner 110*a* (e.g., the semi-spherical formations of discontinuous barrier liner 110*a* exposed by performing one or more planarization processes), continuous barrier layer 114*a*, seed enhancement liner 116*a*, and/or interconnect metallic material 120*a*.

Figure 13:
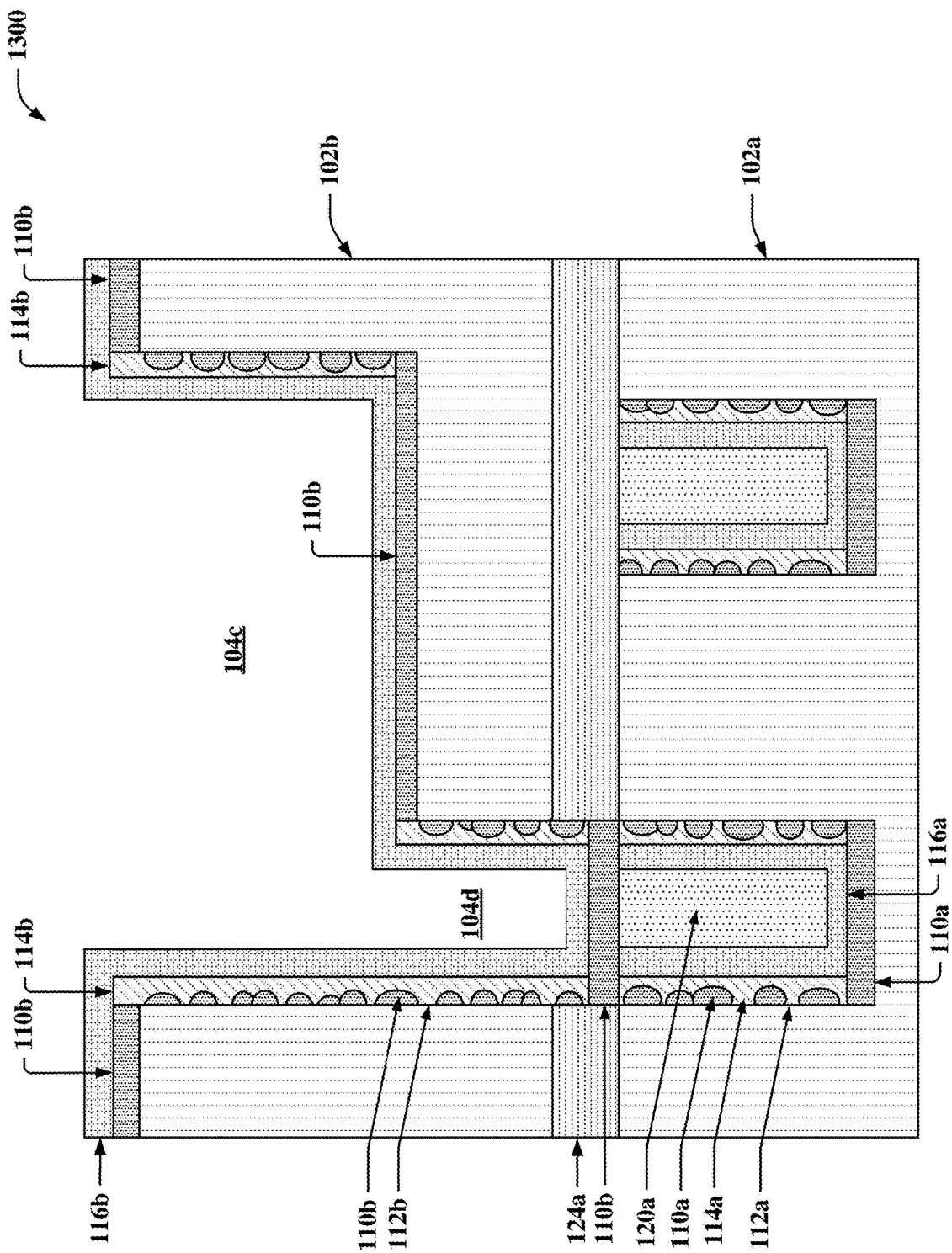
FIG. 13 illustrates a cross-sectional side view of an example, non-limiting interconnect device that can facilitate hybrid sidewall barrier and low resistance interconnect components in accordance with one or more embodiments described herein.

FIG. 13 illustrates a cross-sectional side view of an example, non-limiting interconnect device 1300 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, interconnect device 1300 can comprise an alternative embodiment of interconnect device 1200. In such embodiments, interconnect device 1300 can comprise an alternative embodiment of interconnect device 1200 after formation of a seed enhancement liner 116*b* on physically exposed surfaces of discontinuous barrier liner 110*b* and continuous barrier layer 114*b*.

According to multiple embodiments, seed enhancement liner 116*b* can be coupled (e.g., electrically, chemically, mechanically, etc.) to physically exposed surfaces of discontinuous barrier liner 110*b* and/or continuous barrier layer 114*b*. For example, seed enhancement liner 116*b* can be deposited onto horizontal surfaces of discontinuous barrier liner 110*b* and/or vertical and horizontal surfaces of continuous barrier layer 114*b* such that seed enhancement liner 116*b* forms a continuous layer enclosing such surfaces of discontinuous barrier liner 110*b* and/or continuous barrier layer 114*b* (e.g., as illustrated in FIG. 13). In this example, seed enhancement liner 116*b* can comprise a conformal layer (e.g., as defined above).

In some embodiments, seed enhancement liner 116*b* can be formed on discontinuous barrier liner 110*b* and/or continuous barrier layer 114*b* utilizing one or more deposition processes described above with reference to seed enhancement liner 116*a* and FIG. 5 (e.g., PVD, CVD, ALD, PECVD, sputtering, chemical solution deposition, plating, etc.). In some embodiments, seed enhancement liner 116*b* can be formed on (e.g., chemically and/or mechanically coupled to) discontinuous barrier liner 110*b* and/or continuous barrier layer 114*b* by employing atomic layer deposition (ALD), which can facilitate formation of the continuous character (e.g., conformal character) of seed enhancement liner 116*b*.

Additionally or alternatively, in some embodiments (not illustrated in the figures), where discontinuous barrier liner 110*b* is removed partially or completely from bottom surface 108*d* of opening 104*d*, seed enhancement liner 116*b* can be formed (e.g., via ALD) on surfaces of discontinuous barrier liner 110*a* (e.g., the semi-spherical formations of discontinuous barrier liner 110*a* exposed by performing one or more planarization processes), continuous barrier layer 114*a*, seed enhancement liner 116*a*, and/or interconnect metallic material 120*a*. In these embodiments, partial or complete removal of discontinuous barrier liner 110*b* formed on bottom surface 108*d* and formation of seed enhancement liner 116*b* on physically exposed surfaces of discontinuous barrier liner 110*a* (e.g., the semi-spherical formations of discontinuous barrier liner 110*a*), continuous barrier layer 114*a*, seed enhancement liner 116*a*, and/or interconnect metallic material 120*a*, can provide an alternative example embodiment of interconnect device 1300.

In some embodiments, seed enhancement liner 116*b* can comprise the same material (e.g., low resistance metal or metal alloy) that can be used to form seed enhancement liner 116*a* as described above with reference to FIG. 5. In some embodiments, seed enhancement liner 116*b* can comprise material that is different from the material that can be used to form seed enhancement liner 116*a* described above with reference to FIG. 5. In some embodiments, seed enhancement liner 116*b* can comprise ruthenium (Ru) or cobalt (Co).

In some embodiments, seed enhancement liner 116*b* can comprise a single layer (e.g., as illustrated in FIG. 13) of one of the metals or metal alloys described above. In some embodiments, seed enhancement liner 116*b* can comprise a multi-layered stack (not illustrated in the figures) having at least a first layer of a first metal or metal alloy, and a second layer of a second metal or metal alloy, where the second metal or metal alloy differs in composition from the first metal or metal alloy.

In some embodiments, seed enhancement liner 116*b* can comprise any thickness that does not result in seed enhancement liner 116*b* filling the entirety of openings 104*c*, 104*d*, and/or any thickness that when combined with the thicknesses of discontinuous barrier liner 110*b* and/or continuous barrier layer 114*b*, does not result in seed enhancement liner 116*b* filling the entirety of openings 104*c*, 104*d*. For example, seed enhancement liner 116*b* can comprise a thickness ranging from approximately 1 nm to 80 nm.

Figure 14:
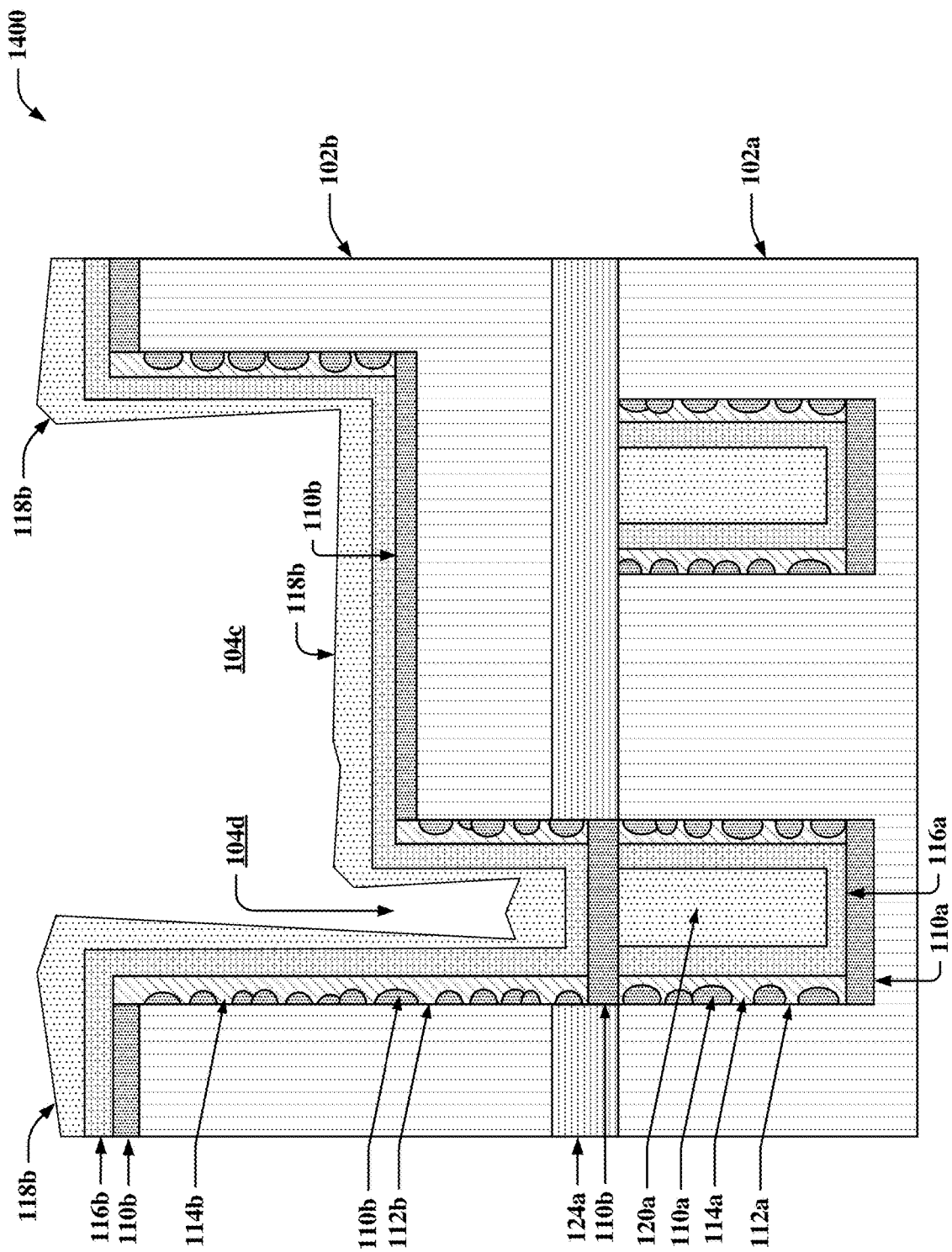
FIG. 14 illustrates a cross-sectional side view of an example, non-limiting interconnect device that can facilitate hybrid sidewall barrier and low resistance interconnect components in accordance with one or more embodiments described herein.

FIG. 14 illustrates a cross-sectional side view of an example, non-limiting interconnect device 1400 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, interconnect device 1400 can comprise an alternative embodiment of interconnect device 1300. In such embodiments, interconnect device 1400 can comprise an alternative embodiment of interconnect device 1300 after formation of an interconnect metallic layer 118*b* on physically exposed surfaces of seed enhancement liner 116*b*.

According to multiple embodiments, interconnect metallic layer 118*b* can be coupled (e.g., electrically, chemically, mechanically, etc.) to physically exposed surfaces of seed enhancement liner 116*b*. For example, interconnect metallic layer 118*b* can be deposited onto horizontal and vertical surfaces of seed enhancement liner 116*b* such that interconnect metallic layer 118*b* forms a continuous layer enclosing such surfaces of seed enhancement liner 116*b* (e.g., as illustrated in FIG. 14).

In some embodiments, interconnect metallic layer 118*b* can comprise a seed layer (e.g., as defined above). For example, interconnect metallic layer 118*b* can comprise an interconnect metallic seed layer. In some embodiments, interconnect metallic layer 118*b* can comprise a non-conformal layer that does not fill in the entirety of the remaining volume of openings 104*c*, 104*d* (e.g., as illustrated in FIG. 14). In such embodiments, the thickness of interconnect metallic layer 118*b* along horizontal surfaces of seed enhancement liner 116*b* can be greater than the thickness of interconnect metallic layer 118*b* along vertical surfaces of seed enhancement liner 116*b* (e.g., as illustrated in FIG. 14).

In some embodiments, interconnect metallic layer 118*b* can comprise the same material (e.g., an interconnect metal or metal alloy) that can be used to form interconnect metallic layer 118*a* as described above with reference to FIG. 6. In some embodiments, interconnect metallic layer 118*b* can comprise material that is different from the material that can be used to form interconnect metallic layer 118*a* described above with reference to FIG. 6. In some embodiments, interconnect metallic layer 118*b* can comprise copper (Cu) or a copper-aluminum alloy.

In some embodiments, interconnect metallic layer 118*b* can be formed on seed enhancement liner 116*b* utilizing one or more deposition processes. For example, interconnect metallic layer 118*b* can be formed on (e.g., chemically and/or mechanically coupled to) seed enhancement liner 116*b* by employing one or more deposition processes including, but not limited to, PVD, CVD, PECVD, sputtering, chemical solution deposition, plating, and/or another deposition process.

Figure 15:
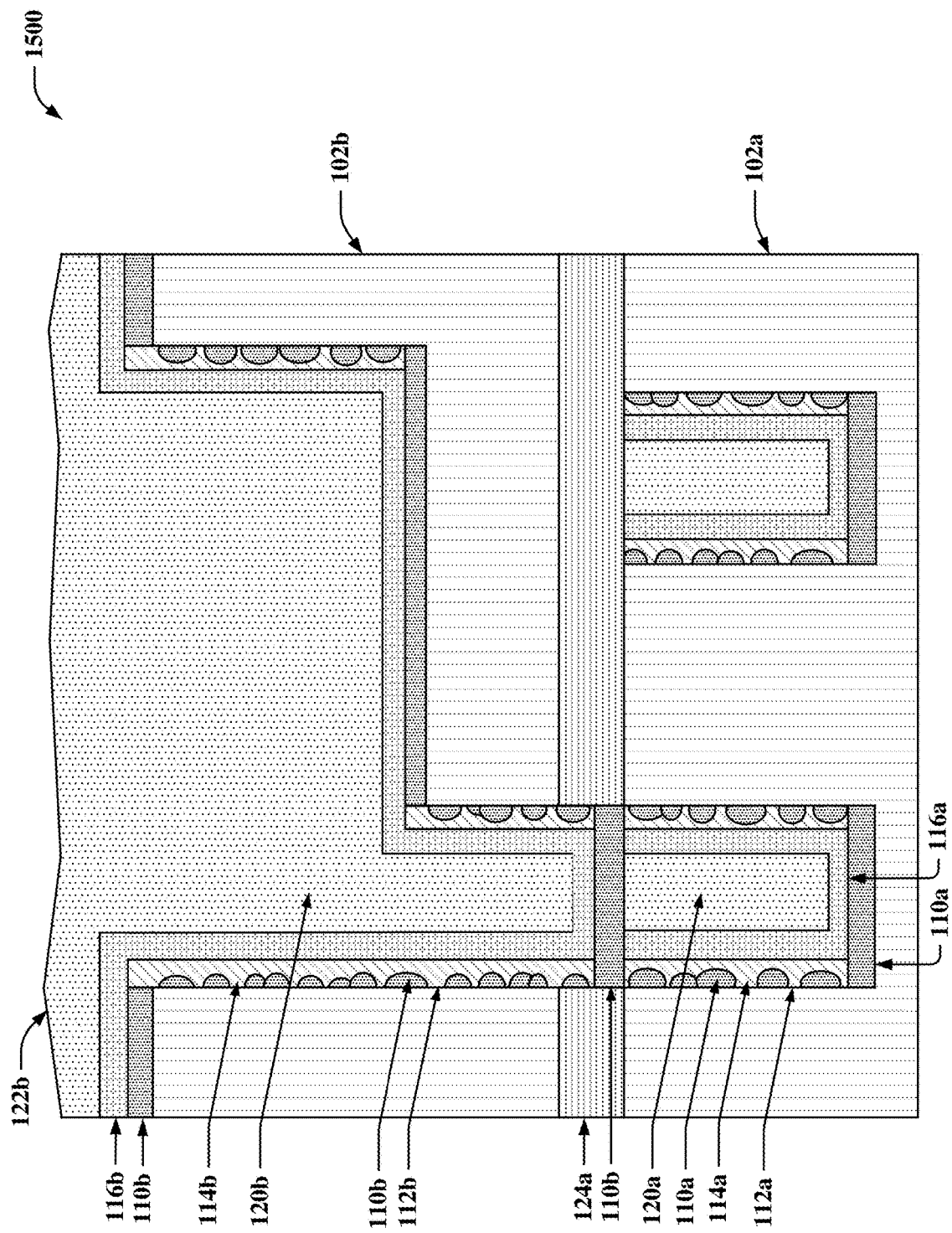
FIG. 15 illustrates a cross-sectional side view of an example, non-limiting interconnect device that can facilitate hybrid sidewall barrier and low resistance interconnect components in accordance with one or more embodiments described herein.

FIG. 15 illustrates a cross-sectional side view of an example, non-limiting interconnect device 1500 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, interconnect device 1500 can comprise an alternative embodiment of interconnect device 1400. In such embodiments, interconnect device 1500 can comprise an alternative embodiment of interconnect device 1400 after filling openings 104*c*, 104*d* with an interconnect metallic material 120*b* and forming an interconnect metallic material overburden 122*b*.

According to some embodiments, interconnect metallic material 120*b* can be formed within openings 104*c*, 104*d* such that interconnect metallic material 120*b* fills the remaining volume of openings 104*c*, 104*d* after forming discontinuous barrier liner 110*b*, continuous barrier layer 114*b*, seed enhancement liner 116*b*, and interconnect metallic layer 118*b*. In some embodiments, interconnect metallic material 120*b* can be formed by employing a fill process such as, for example, electroplating to fill the remaining volume of openings 104*c*, 104*d* with an interconnect metal or metal alloy, and form an overburden (e.g., interconnect metallic material overburden 122*b*) of the interconnect metal or metal alloy outside openings 104*c*, 104*d* (e.g., as illustrated in FIG. 15).

In some embodiments, interconnect metallic material 120*b* can be formed by employing a bottom-up plating process to fill openings 104*c*, 104*d* with an interconnect metal or metal alloy (e.g., copper (Cu), aluminum (Al), a copper alloy, an aluminum alloy, a copper-aluminum alloy, etc.). In some embodiments, interconnect metallic material 120*b* can be formed by performing a reflow anneal process (not depicted in FIG. 15) as described above with reference to interconnect metallic material 120*a*, interconnect metallic material overburden 122*a*, and FIG. 7. In such embodiments, the reflow anneal can be employed to cause the interconnect metal or metal alloy of interconnect metallic layer 118*b* to flow into openings 104*c*, 104*d*, thereby filling the remaining volume of openings 104*c*, 104*d* with the interconnect metal or metal alloy to form interconnect metallic material 120*b* and interconnect metallic material overburden 122*b*. In some embodiments, the reflow anneal can comprise the same thermal anneal that can be utilized to form interconnect metallic material 120*a* and/or interconnect metallic material overburden 122*a* as described above with reference to FIG. 7 (e.g., via a furnace anneal or a hot plate anneal).

In some embodiments, interconnect metallic material 120*b* and/or interconnect metallic material overburden 122*b* can comprise an interconnect metal or metal alloy. For example, interconnect metallic material 120*b* and/or interconnect metallic material overburden 122*a* can comprise an interconnect metal or metal alloy such as, for example, copper (Cu), aluminum (Al), a copper alloy, an aluminum alloy, a copper-aluminum alloy, and/or another interconnect metal or metal alloy.

Figure 16:
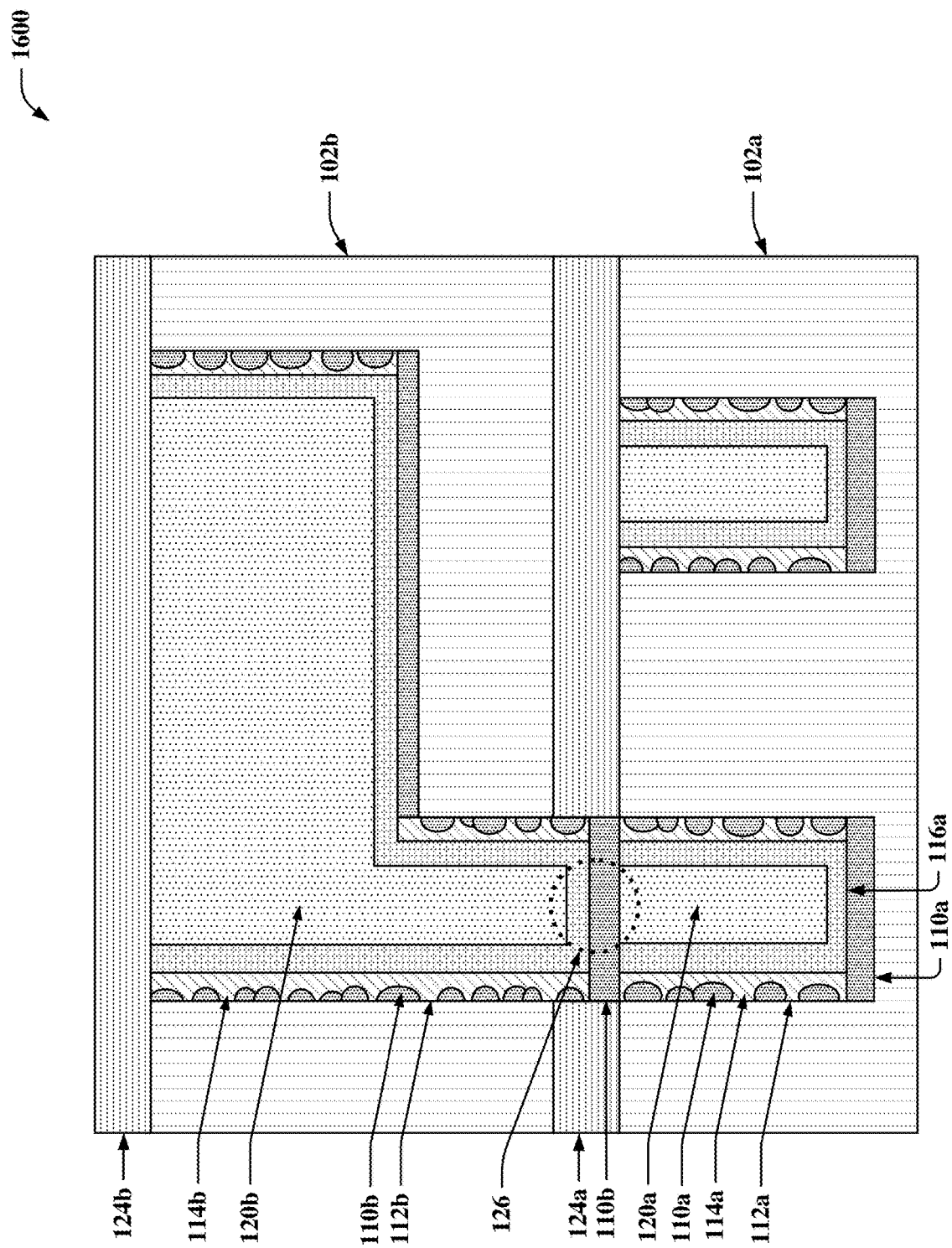
FIG. 16 illustrates a cross-sectional side view of an example, non-limiting interconnect device that can facilitate hybrid sidewall barrier and low resistance interconnect components in accordance with one or more embodiments described herein.

FIG. 16 illustrates a cross-sectional side view of an example, non-limiting interconnect device 1600 that can facilitate hybrid sidewall barrier and low resistance interconnect components in accordance with one or more embodiments described herein. Repetitive description of like elements and/or processes employed in other embodiments described herein is omitted for sake of brevity.

In some embodiments, interconnect device 1600 can comprise an alternative embodiment of interconnect device 1500. In such embodiments, interconnect device 1600 can comprise an alternative embodiment of interconnect device 1500 after: removal of interconnect metallic material overburden 122*a*, as well as portions of interconnect metallic material 120*b*, seed enhancement liner 116*b*, continuous barrier layer 114*b*, and/or discontinuous barrier liner 110*b*; and/or formation of a cap layer 124*b* on interconnect material layer 102*b*.

According to multiple embodiments, interconnect metallic material overburden 122*a*, as well as portions of interconnect metallic material 120*b*, seed enhancement liner 116*b*, continuous barrier layer 114*b*, and/or discontinuous barrier liner 110*b* can be removed from interconnect device 1500 to form interconnect device 1600. For example, interconnect metallic material overburden 122*a*, as well as portions of interconnect metallic material 120*b*, seed enhancement liner 116*b*, continuous barrier layer 114*b*, and/or discontinuous barrier liner 110*b* can be removed from interconnect device 1500 by performing a planarization process including, but not limited to, chemical-mechanical polishing (CMP), backgrinding, and/or another planarization process. In some embodiments, one or more such planarization processes can be performed to remove all material present outside openings 104*c*, 104*d* and all material located above the topmost surface of interconnect material layer 102*b*. In such embodiments, employing one or more such planarization processes can remove all of interconnect metallic material overburden 122*a*, as well as some portions of interconnect metallic material 120*b*, seed enhancement liner 116*b*, continuous barrier layer 114*b*, and/or discontinuous barrier liner 110*b* (e.g., as illustrated in FIG. 16).

According to multiple embodiments, cap layer 124*b* can be coupled (e.g., electrically, chemically, mechanically, etc.) to surfaces of interconnect device 1500 physically exposed by performing one or more planarization processes described above. For example, cap layer 124*b* can be coupled (e.g., electrically, chemically, mechanically, etc.) to surfaces of discontinuous barrier liner 110*b* (e.g., the semispherical formations of discontinuous barrier liner 110*b*), continuous barrier layer 114b, seed enhancement liner 116b, and/or interconnect metallic material 120b.

In some embodiments, cap layer 124b can be formed on surfaces of discontinuous barrier liner 110b (e.g., the semi-spherical formations of discontinuous barrier liner 110b), continuous barrier layer 114b, seed enhancement liner 116b, and/or interconnect metallic material 120b utilizing one or more deposition processes described above with reference to cap layer 124a and FIG. 8 (e.g., PVD, CVD, ALD, PECVD, sputtering, chemical solution deposition, plating, etc.). In some embodiments, the formation of cap layer 124b can be omitted.

In some embodiments, cap layer 124b can the same material (e.g., dielectric material) that can be used to form cap layer 124a as described above with reference to FIG. 8. In some embodiments, cap layer 124b can comprise material that is different from the material that can be used to form cap layer 124a described above with reference to FIG. 8.

In some embodiments, cap layer 124b can comprise a thickness that can vary depending upon the type of dielectric material used. For example, cap layer 124b can be ground (e.g., via backgrinding) to a thickness (e.g., height) ranging from 10 nm to 100 nm. In some embodiments, cap layer 124b can comprise a thickness that is less than 10 nm or greater than 100 nm.

In some embodiments, the processing steps described above with reference to FIGS. 9-16 can be repeated numerous times to provide other interconnect levels atop the two interconnect levels shown in FIG. 16. For example, the processing steps described above with reference to FIGS. 9-16 can be repeated numerous times to provide multiple interconnect material layers 102a, 102b that can be formed on top of interconnect device 1600.

In some embodiments, device 800 and/or interconnect device 1600 can comprise a hybrid sidewall barrier low resistance interconnect device, system, and/or process for fabricating the same that can be associated with various technologies. For example, device 800 and/or interconnect device 1600 can be associated with semiconductor device technologies, semiconductor interconnect technologies, semiconductor device fabrication technologies, semiconductor back end of line (BEOL) technologies, semiconductor metallization layer technologies, and/or other technologies.

In some embodiments, device 800 and/or interconnect device 1600 can provide technical improvements to devices, systems, components, operational steps, and/or processing steps associated with the various technologies listed above. For example, formation of discontinuous barrier liners 110a, 110b on sidewalls 106a, 106b, 106c, 106d (e.g., via PVD), and continuous barrier layers 114a, 114b on discontinuous barrier liners 110a, 110b and sections 112a, 112b (e.g., via ALD), can prevent formation of voids between sidewalls 106a, 106b, 106c, 106d and interconnect metallic materials 120a, 120b. For instance, formation of continuous barrier layers 114a, 114b on the semi-spherical formations of discontinuous barrier liners 110a, 110b and sections 112a, 112b (e.g., via ALD as described above with reference to FIGS. 3 & 11), can prevent voids between sidewalls 106a, 106b, 106c, 106d and seed enhancement liners 116a, 116b. In this example, such formation of continuous barrier layers 114a, 114b can provide a continuous (e.g., void-free) surface on which seed enhancement liners 116a, 116b can be deposited utilizing ALD, which can provide a continuous (e.g., void-free) surface on which interconnect metallic material 120a, 120b can be formed.

It should be further appreciated that, in some embodiments, formation of discontinuous barrier liner 110b on bottom surface 108d can be performed utilizing PVD (e.g., as described above with reference to FIG. 9), which can provide a continuous (e.g., void-free) surface on which seed enhancement liner 116b can be deposited utilizing ALD (e.g., as described above with reference to FIG. 13). In these embodiments, such formation of discontinuous barrier liner 110b utilizing PVD and seed enhancement liner 116b utilizing ALD, can provide a diffusion barrier layer and a seed enhancement layer, respectively, that can each facilitate low electrical resistance. For example, such formation of discontinuous barrier liner 110b utilizing PVD and seed enhancement liner 116b utilizing ALD, can provide a diffusion barrier layer and a seed enhancement layer, respectively, that can each facilitate low electrical resistance between interconnect metallic material 120a and interconnect metallic material 120b.

It should also be appreciated that, in some embodiments (not illustrated in the figures), removal of discontinuous barrier liner 110b from bottom surface 108d and formation of seed enhancement liner 116b on bottom surface 108d (e.g., as described above with reference to FIGS. 12 & 13), can provide a seed enhancement layer that can facilitate low electrical resistance. For example, such formation of seed enhancement liner 116b utilizing ALD can provide a seed enhancement layer that can facilitate low electrical resistance between interconnect metallic material 120a and interconnect metallic material 120b.

In some embodiments, device 800 and/or interconnect device 1600 can provide technical improvements to a processing unit associated with device 800 and/or interconnect device 1600. For example, the improved electrical coupling between interconnect metallic material 120a and interconnect metallic material 120b provided by the low electrical resistance of discontinuous barrier liner 110b and/or seed enhancement liner 116b (e.g., as described above), can facilitate improved electrical connectivity necessary to perform processing workloads of a processing unit associated with device 800 and/or interconnect device 1600. In this example, such improved electrical connectivity can facilitate fewer processing cycles required to complete a given processing workload, thereby facilitating improved processing efficiency and/or performance of a processing unit comprising device 800 and/or interconnect device 1600, which can reduce power consumption by such processing unit.

In some embodiments, device 800 and/or interconnect device 1600 can be coupled to hardware and/or software to solve problems that are highly technical in nature, that are not abstract and that cannot be performed as a set of mental acts by a human. For example, device 800 and/or interconnect device 1600 can be employed in a semiconductor device (e.g., integrated circuit) used to implement a computing device that can process information and/or execute calculations that are not abstract and that cannot be performed as a set of mental acts by a human.

It should be appreciated that device 800 and/or interconnect device 1600 can facilitate a hybrid sidewall barrier low resistance semiconductor interconnection utilizing various combinations of electrical components, mechanical components, and circuitry that cannot be replicated in the mind of a human or performed by a human. For example, facilitating a hybrid sidewall barrier low resistance semiconductor interconnection that can enable operation of a computing device (e.g., a processor of a computing device) is an operation that is greater than the capability of a human mind. For instance, the amount of data processed, the speed of processing such data, and/or the types of data processed over a certain period of time by such a computing device utilizing device 800 and/or interconnect device 1600 can be greater, faster, and/or different than the amount, speed, and/or data type that can be processed by a human mind over the same period of time.

According to several embodiments, device 800 and/or interconnect device 1600 can also be fully operational towards performing one or more other functions (e.g., fully powered on, fully executed, etc.) while also performing the above-referenced hybrid sidewall barrier low resistance semiconductor interconnection. It should also be appreciated that such simultaneous multi-operational execution is beyond the capability of a human mind. It should also be appreciated that device 800 and/or interconnect device 1600 can include information that is impossible to obtain manually by an entity, such as a human user. For example, the type, amount, and/or variety of information included in device 800 and/or interconnect device 1600 can be more complex than information obtained manually by a human user.

Figure 17:
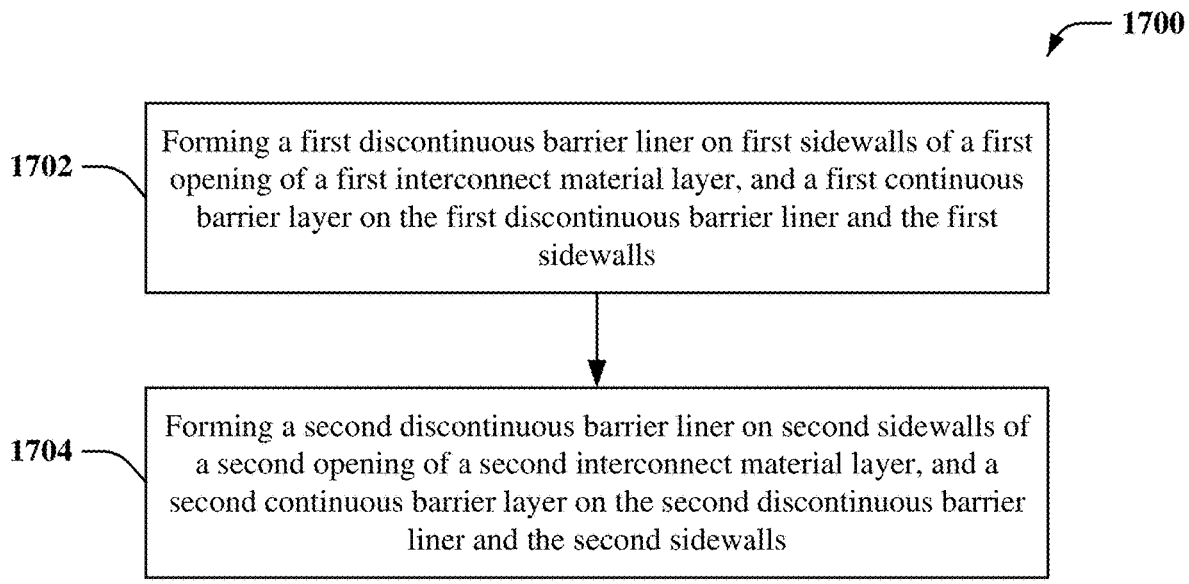
FIG. 17 illustrates a flow diagram of an example, non-limiting method that can facilitate implementing hybrid sidewall barrier and low resistance interconnect components in accordance with one or more embodiments described herein.

FIG. 17 illustrates a flow diagram of an example, non-limiting method 1700 that can facilitate implementing hybrid sidewall barrier and low resistance interconnect components in accordance with one or more embodiments described herein. Repetitive description of like elements and/or processes employed in other embodiments described herein is omitted for sake of brevity.

In some embodiments, method 1700 can be implemented by a computing system (e.g., operating environment 1900 illustrated in FIG. 19 and described below) and/or a computing device (e.g., computer 1912 illustrated in FIG. 19 and described below). In non-limiting example embodiments, such computing system (e.g., operating environment 1900) and/or such computing device (e.g., computer 1912) can comprise one or more processors and one or more memory devices that can store executable instructions thereon that, when executed by the one or more processors, can facilitate performance of the operations described herein, including the non-limiting operations of method 1700 illustrated in FIG. 17. As a non-limiting example, the one or more processors can facilitate performance of the operations described herein, for example, method 1700, by directing and/or controlling one or more systems and/or equipment operable to perform semiconductor fabrication.

At 1702, forming (e.g., via computer 1912) a first discontinuous barrier liner (e.g., discontinuous barrier liner 110*a*) on first sidewalls (e.g., sidewalls 106*a*, 106*b*) of a first opening (e.g., opening 104*a* and/or opening 104*b*) of a first interconnect material layer (e.g., interconnect material layer 102*a*), and a first continuous barrier layer (e.g., continuous barrier layer 114*a*) on the first discontinuous barrier liner and the first sidewalls. In some embodiments, forming such a first discontinuous barrier liner (e.g., discontinuous barrier liner 110*a*) can be performed (e.g., via computer 1912) utilizing PVD (e.g., as described above with reference to FIG. 2). In some embodiments, forming such a first continuous barrier layer (e.g., continuous barrier layer 114*a*) can be performed (e.g., via computer 1912) utilizing ALD (e.g., as described above with reference to FIG. 3), thereby providing a continuous (e.g., void-free) surface on which a seed enhancement layer (e.g., seed enhancement liner 116*a*) can be formed.

At 1704, forming (e.g., via computer 1912) a second discontinuous barrier liner (e.g., discontinuous barrier liner 110*b*) on second sidewalls (e.g., sidewalls 106*c*, 106*d*) of a second opening (e.g., opening 104*c* and/or opening 104*d*) of a second interconnect material layer (e.g., interconnect material layer 102*b*), and a second continuous barrier layer on the second discontinuous barrier liner and the second sidewalls. In some embodiments, forming such a second discontinuous barrier liner (e.g., discontinuous barrier liner 110*b*) can be performed (e.g., via computer 1912) utilizing PVD (e.g., as described above with reference to FIG. 10). In some embodiments, forming such a second continuous barrier layer (e.g., continuous barrier layer 114*b*) can be performed (e.g., via computer 1912) utilizing ALD (e.g., as described above with reference to FIG. 11), thereby providing a continuous (e.g., void-free) surface on which a seed enhancement layer (e.g., seed enhancement liner 116*b*) can be formed.

FIG. 18 illustrates a flow diagram of an example, non-limiting method 1800 that can facilitate implementing hybrid sidewall barrier and low resistance interconnect components in accordance with one or more embodiments described herein. Repetitive description of like elements and/or processes employed in other embodiments described herein is omitted for sake of brevity.

In some embodiments, method 1800 can be implemented by a computing system (e.g., operating environment 1900 illustrated in FIG. 19 and described below) and/or a computing device (e.g., computer 1912 illustrated in FIG. 19 and described below). In non-limiting example embodiments, such computing system (e.g., operating environment 1900) and/or such computing device (e.g., computer 1912) can comprise one or more processors and one or more memory devices that can store executable instructions thereon that, when executed by the one or more processors, can facilitate performance of the operations described herein, including the non-limiting operations of method 1800 illustrated in FIG. 18. As a non-limiting example, the one or more processors can facilitate performance of the operations described herein, for example, method 1800, by directing and/or controlling one or more systems and/or equipment operable to perform semiconductor fabrication.

At 1802, forming (e.g., via computer 1912) a first discontinuous barrier liner (e.g., discontinuous barrier liner 110*a*) on first sidewalls (e.g., sidewalls 106*a*, 106*b*) of a first opening (e.g., opening 104*a* and/or opening 104*b*) of a first interconnect material layer (e.g., interconnect material layer 102*a*), and a first continuous barrier layer (e.g., continuous barrier layer 114*a*) on the first discontinuous barrier liner and the first sidewalls. In some embodiments, forming such a first discontinuous barrier liner (e.g., discontinuous barrier liner 110*a*) can be performed (e.g., via computer 1912) utilizing PVD (e.g., as described above with reference to FIG. 2). In some embodiments, forming such a first continuous barrier layer (e.g., continuous barrier layer 114*a*) can be performed (e.g., via computer 1912) utilizing ALD (e.g., as described above with reference to FIG. 3), thereby providing a continuous (e.g., void-free) surface on which a seed enhancement layer (e.g., seed enhancement liner 116*a*) can be formed.

At 1804, forming (e.g., via computer 1912) a second discontinuous barrier liner (e.g., discontinuous barrier liner 110*b*) on second sidewalls (e.g., sidewalls 106*c*, 106*d*) of a second opening (e.g., opening 104*c* and/or opening 104*d*) of a second interconnect material layer (e.g., interconnect material layer 102*b*), and a second continuous barrier layer on the second discontinuous barrier liner and the second sidewalls. In some embodiments, forming such a second discontinuous barrier liner (e.g., discontinuous barrier liner 110*b*) can be performed (e.g., via computer 1912) utilizing PVD (e.g., as described above with reference to FIG. 10). In some embodiments, forming such a second continuous barrier layer (e.g., continuous barrier layer 114b) can be performed (e.g., via computer 1912) utilizing ALD (e.g., as described above with reference to FIG. 11), thereby providing a continuous (e.g., void-free) surface on which a seed enhancement layer (e.g., seed enhancement liner 116b) can be formed.

At 1806, removing (e.g., via computer 1912) a portion of the second continuous barrier layer formed on a section of the second discontinuous barrier liner formed on a bottom surface (e.g., bottom surface 108d) of the second opening (e.g., as described above with reference to FIG. 12); and forming a second seed enhancement liner (e.g., seed enhancement liner 116b) on the second continuous barrier layer (e.g., as described above with reference to FIG. 13).

At 1808, coupling (e.g., via computer 1912) a first interconnect metallic material (e.g., interconnect metallic material 120a) to a first seed enhancement liner (e.g., seed enhancement liner 116a) formed (e.g., by implementing ALD via computer 1912) on the first continuous barrier layer, and a second interconnect metallic material (e.g., interconnect metallic material 120b) to a second seed enhancement liner (e.g., seed enhancement liner 116b) formed (e.g., by implementing ALD via computer 1912) on the bottom surface (e.g., bottom surface 108d as described above with reference to FIG. 12).

At 1810, electrically coupling the first interconnect metallic material to the second interconnect metallic material. For example, the electrically coupling of operation 1810 can be implemented by: forming (e.g., via computer 1912) interconnect metallic material 120b on seed enhancement liner 116b; forming (e.g., via computer 1912) seed enhancement liner 116 on discontinuous barrier liner 110b; and forming (e.g., via computer 1912) discontinuous barrier liner 110b on interconnect metallic material 120a (e.g., as described above with reference to FIGS. 10-14). It should be appreciated that, in some embodiments, formation of discontinuous barrier liner 110b utilizing PVD and seed enhancement liner 116b utilizing ALD, can provide a diffusion barrier layer and a seed enhancement layer, respectively, that can each facilitate low electrical resistance between interconnect metallic material 120a and interconnect metallic material 120b, thereby facilitating electrical coupling of interconnect metallic material 120a and interconnect metallic material 120b.

For simplicity of explanation, the methodologies described herein (e.g., computer-implemented methodologies) are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the methodologies described herein (e.g., computer-implemented methodologies) in accordance with the disclosed subject matter. In addition, those skilled in the art will understand and appreciate that such methodologies could alternatively be represented as a series of interrelated states via a state diagram or events. Additionally, it should be further appreciated that the methodologies (e.g., computer-implemented methodologies) disclosed hereinafter and throughout this specification are capable of being stored on an article of manufacture to facilitate transporting and transferring such methodologies (e.g., computer-implemented methodologies) to computers. The term article of manufacture, as used herein, is intended to encompass a computer program accessible from any computer-readable device or storage media.

Figure 19:
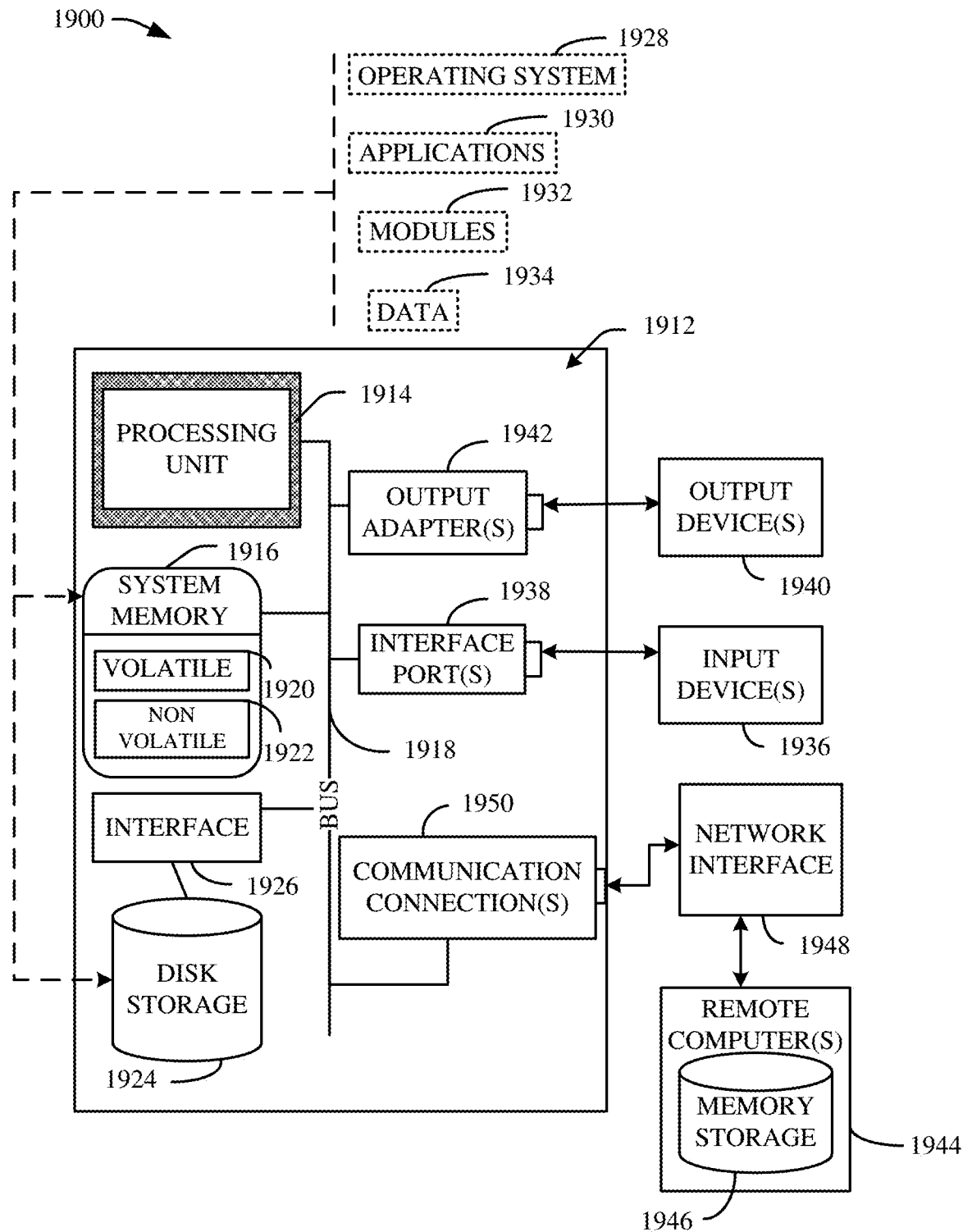
FIG. 19 illustrates a block diagram of an example, non-limiting operating environment in which one or more embodiments described herein can be facilitated.

In order to provide a context for the various aspects of the disclosed subject matter, FIG. 19 as well as the following discussion are intended to provide a general description of a suitable environment in which the various aspects of the disclosed subject matter can be implemented. FIG. 19 illustrates a block diagram of an example, non-limiting operating environment in which one or more embodiments described herein can be facilitated. For example, operating environment 1900 can be used to implement the example, non-limiting method 1700 of FIG. 17 and/or non-limiting method 1800 of FIG. 18, both of which facilitate implementing various embodiments of the subject disclosure described herein. Repetitive description of like elements and/or processes employed in other embodiments described herein is omitted for sake of brevity.

With reference to FIG. 19, a suitable operating environment 1900 for implementing various aspects of this disclosure can also include a computer 1912. The computer 1912 can also include a processing unit 1914, a system memory 1916, and a system bus 1918. The system bus 1918 couples system components including, but not limited to, the system memory 1916 to the processing unit 1914. The processing unit 1914 can be any of various available processors. Dual microprocessors and other multiprocessor architectures also can be employed as the processing unit 1914. The system bus 1918 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1916 can also include volatile memory 1920 and nonvolatile memory 1922. The basic input/output system (BIOS), containing the basic routines to transfer information between elements within the computer 1912, such as during start-up, is stored in nonvolatile memory 1922. Computer 1912 can also include removable/non-removable, volatile/non-volatile computer storage media. FIG. 19 illustrates, for example, a disk storage 1924. Disk storage 1924 can also include, but is not limited to, devices like a magnetic disk drive, floppy disk drive, tape drive, Jaz drive, Zip drive, LS-100 drive, flash memory card, or memory stick. The disk storage 1924 also can include storage media separately or in combination with other storage media. To facilitate connection of the disk storage 1924 to the system bus 1918, a removable or non-removable interface is typically used, such as interface 1926. FIG. 19 also depicts software that acts as an intermediary between users and the basic computer resources described in the suitable operating environment 1900. Such software can also include, for example, an operating system 1928. Operating system 1928, which can be stored on disk storage 1924, acts to control and allocate resources of the computer 1912.

System applications 1930 take advantage of the management of resources by operating system 1928 through program modules 1932 and program data 1934, e.g., stored either in system memory 1916 or on disk storage 1924. It is to be appreciated that this disclosure can be implemented with various operating systems or combinations of operating systems. A user enters commands or information into the computer 1912 through input device(s) 1936. Input devices 1936 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1914 through the system bus 1918 via interface port(s) 1938. Interface port(s) 1938 include, for example, a serial port, a parallel port, a game port, and a universal serial bus (USB). Output device(s) 1940 use some of the same type of ports as input device(s) 1936. Thus, for example, a USB port can be used to provide input to computer 1912, and to output information from computer 1912 to an output device 1940. Output adapter 1942 is provided to illustrate that there are some output devices 1940 like monitors, speakers, and printers, among other output devices 1940, which require special adapters. The output adapters 1942 include, by way of illustration and not limitation, video and sound cards that provide a means of connection between the output device 1940 and the system bus 1918. It should be noted that other devices and/or systems of devices provide both input and output capabilities such as remote computer(s) 1944.

Computer 1912 can operate in a networked environment using logical connections to one or more remote computers, such as remote computer(s) 1944. The remote computer(s) 1944 can be a computer, a server, a router, a network PC, a workstation, a microprocessor based appliance, a peer device or other common network node and the like, and typically can also include many or all of the elements described relative to computer 1912. For purposes of brevity, only a memory storage device 1946 is illustrated with remote computer(s) 1944. Remote computer(s) 1944 is logically connected to computer 1912 through a network interface 1948 and then physically connected via communication connection 1950. Network interface 1948 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1950 refers to the hardware/software employed to connect the network interface 1948 to the system bus 1918. While communication connection 1950 is shown for illustrative clarity inside computer 1912, it can also be external to computer 1912. The hardware/software for connection to the network interface 1948 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, singlecore processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
    an interconnect material layer having an opening forming a first side of the interconnect material layer and a second side of the interconnect material layer and comprising a barrier liner that is discontinuous and coupled to sidewalls of the opening and wherein the barrier liner covers a bottom surface of the opening,
    wherein, on the sidewalls, which are substantially parallel to one another, the barrier liner is discontinuous and formed as a plurality of semi-spherical portions spaced apart from one another such that one or more sections along the sidewalls fail to include the barrier liner, and wherein, across the bottom surface of the opening, between the two sidewalls, the barrier liner is continuous and formed as substantially flat portions;
    a second barrier layer that provides a continuous coating over a first portion of the barrier liner that is discontinuous over the sidewalls, and a second portion of the barrier liner that is continuous across the bottom surface of the opening,
    a seed enhancement liner coupled to and covering a first portion of the second electrical conductivity of the seed enhancement liner,
    wherein the barrier liner is directly connected to and between the seed enhancement liner and the interconnect material layer, and wherein the seed enhancement liner is directly connected to and between an interconnect metallic material and the barrier liner; and
    a cap layer formed as a continuous substantially flat layer across a top of:
    the first side of the interconnect material layer, the second side of the interconnect material layer, the first portion of the barrier liner, the seed enhancement liner, the interconnect metallic material and the opening.

2. The device of claim 1, wherein the seed enhancement liner comprises at least one of ruthenium, rhodium, iridium, osmium, or cobalt.

3. The device of claim 2, wherein the interconnect metallic material comprises at least one of copper or aluminum.

4. The device of claim 1, wherein the interconnect material layer comprises an interconnect dielectric material layer.

5. The device of claim 1, wherein the barrier liner comprises a discontinuous diffusion barrier liner selected from a group consisting of tantalum nitride, tantalum tungsten, tantalum titanium, and tantalum niobium.

6. The device of claim 1, wherein the second barrier layer comprises a continuous diffusion barrier layer selected from a group consisting of tantalum nitride, tungsten nitride, titanium nitride, and niobium nitride.

* * * * *